United States Patent [19]

Yamamura et al.

[11] Patent Number: 5,436,913
[45] Date of Patent: Jul. 25, 1995

[54] NON-VOLATILE SEMICONDUCTOR MEMORY DEVICE USING SUCCESSIVELY LONGER WRITE PULSES

[75] Inventors: Toshio Yamamura; Hiroto Nakai, both of Yokohama; Hideo Kato, Kawasaki; Kaoru Tokushige, Yokohama; Masamichi Asano, Ota, all of Japan

[73] Assignee: Kabushiki Kaisha Toshiba, Kanagawa, Japan

[21] Appl. No.: 69,911

[22] Filed: Jun. 1, 1993

[30] Foreign Application Priority Data

Jun. 2, 1992 [JP] Japan .................. 4-141240

[51] Int. Cl.$^6$ .............................................. G06F 11/00
[52] U.S. Cl. .................................. 371/21.2; 371/21.4; 365/189.07
[58] Field of Search ................... 371/21.2, 21.4, 28; 365/189.07

[56] References Cited

U.S. PATENT DOCUMENTS

| | | | |
|---|---|---|---|
| 4,460,982 | 7/1984 | Gee et al. | 371/21.4 |
| 4,963,825 | 10/1990 | Mielke | 371/21.4 |
| 5,034,922 | 7/1991 | Burgess | 365/189.07 |
| 5,161,161 | 11/1992 | Malek-Khoscavi et al. | 371/28 |

FOREIGN PATENT DOCUMENTS

0441510A2  1/1991  European Pat. Off. .
63-255900  10/1983  Japan ..................... G11C 17/00
554683  3/1993  Japan ..................... G11C 16/06

OTHER PUBLICATIONS

1991 IEEE Journal of Solid–State Circuits, vol. 26, No. 4, Apr. 1991. Masaki Momodomi, et al., "A 4–Mb NAND EEPROM with Tight Programmed VHd t Distribution", pp. 492–445.

Primary Examiner—Jack B. Harvey
Assistant Examiner—Jeffrey K. Seto
Attorney, Agent, or Firm—Spensley Horn Jubas & Lubitz

[57] ABSTRACT

A non-volatile semiconductor memory device has writing part (203, 205, 209) for writing data in a non-volatile memory cell in response to a write pulse, readout part (419) for reading out data stored in the memory cell, and verification part (207, 210; 417) for verifying to ensure that normal writing has been completed by reading data from the memory cell after each writing. The device repeats writings unless a normal writing can be confirmed by the verification part. At this time, the writing part can vary writing time and in a part of a sequence of repeating writing unless a normal writing can be confirmed, it sets writing time longer for the next writing action than that for one writing action. Since this setting is performed according to constant multiplication, constant increment, or constant multiplication of accumulated value, necessary time for obtaining normal data write can be reduced.

10 Claims, 25 Drawing Sheets

| NUMBER OF TIMES | EMBODIMENTS 1, 2 | | EMBODIMENT 3 | | EMBODIMENT 4 | | EMBODIMENT 5 | | EMBODIMENT 6 | |
|---|---|---|---|---|---|---|---|---|---|---|
| n | F2 | ΣF2 | F2 | ΣF2 | F2 | ΣF2 | F2 | ΣF2 | F2 | ΣF2 |
| 1 | t | t | t | t | 2t | 2t | 2t | 2t | t | t |
| 2 | 2t | 3t | 2t | 3t | 2 | 4t | 4t | 6t | $\frac{1}{2}t$ | $\frac{3}{2}t$ |
| 3 | 4t | 7t | 4t | 7t | 2t | 6t | 8t | 14t | $\frac{3}{4}t$ | $\frac{9}{4}t$ |
| 4 | 8t | 15t | 8t | 15t | 2t | 8t | 8t | 22t | $\frac{5}{4}t$ | $\frac{14}{4}t$ |
| 5 | 16t | 31t | 16t | 31t | 4t | 12t | 8t | 30t | $\frac{7}{4}t$ | $\frac{21}{4}t$ |
| 6 | 32t | 63t | 16t | 47t | 8t | 20t | 8t | 38t | 3t | $\frac{33}{4}t$ |
| 7 | 64 | 127t | 16t | 13t | 16t | 36t | 8t | 46t | 4t | $\frac{49}{4}t$ |
| 8 | 128t | 255t | 16t | 79t | 32t | 68t | 8t | 54t | 6t | $\frac{73}{4}t$ |
| 9 | 256 | 511t | 16t | 95t | 64t | 132t | 8t | 62t | 9t | $\frac{109}{4}t$ |
| 10 | 512t | 1023t | 16t | 111t | 64t | 196t | 8t | 70t | 14t | $\frac{165}{4}t$ |

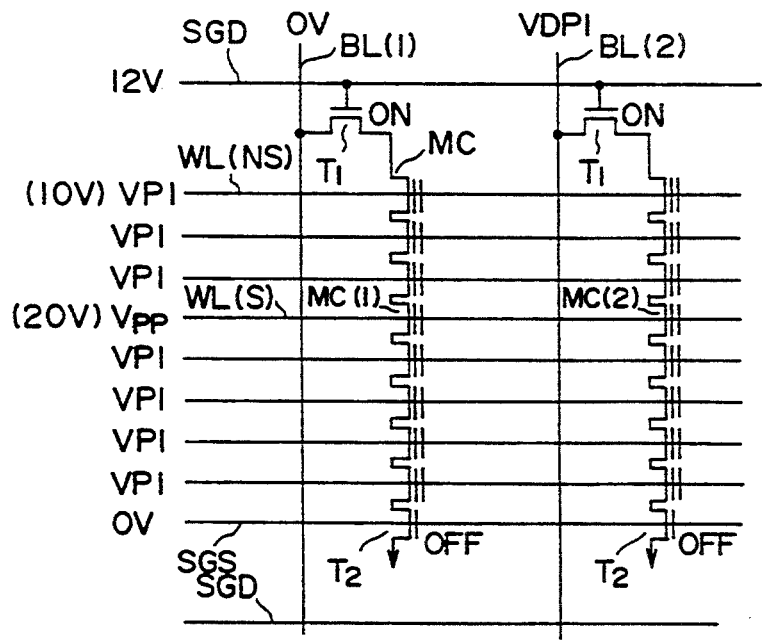
FIG. 4
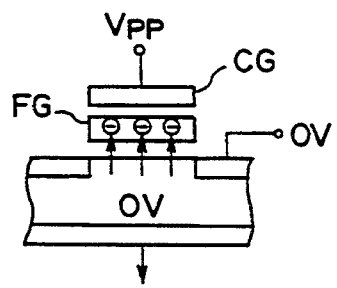
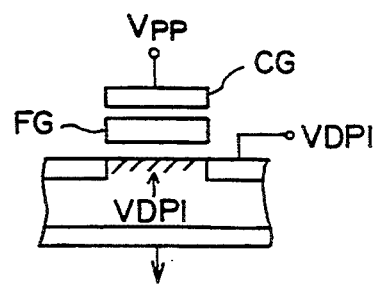
FIG. 5  FIG. 6

|  | N0 N1 N2 | A B C E F G |
|---|---|---|
| S1 | L L L | H H H L L L |
| S2 | H L L | H H H H L L |
| S3 | L H L | H H H H H L |
| S4 | H H L | H H H H H H |
| S5 | L L H | L H H H H H |
| S6 | H L H | L L H H H H |
| S7 | L H H | L L L H H H |

FIG.17

N2B ——————————— A
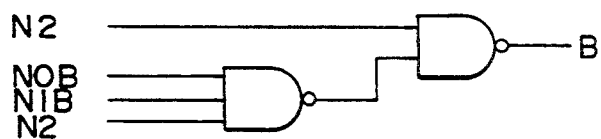
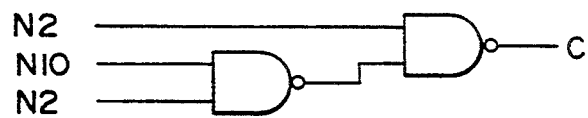
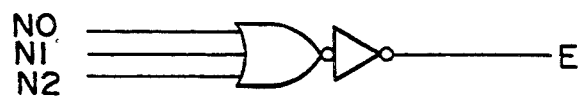
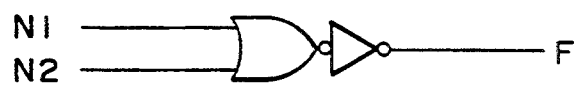
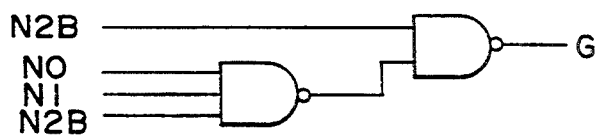
FIG. 18

FIG.21

| NUMBER OF TIMES n | EMBODIMENTS 1,2 F2 | EMBODIMENTS 1,2 ΣF2 | EMBODIMENT 3 F2 | EMBODIMENT 3 ΣF2 | EMBODIMENT 4 F2 | EMBODIMENT 4 ΣF2 | EMBODIMENT 5 F2 | EMBODIMENT 5 ΣF2 | EMBODIMENT 6 F2 | EMBODIMENT 6 ΣF2 |
|---|---|---|---|---|---|---|---|---|---|---|
| 1 | t | t | t | t | 2t | 2t | 2t | 2t | t | t |
| 2 | 2t | 3t | 2t | 3t | 2 | 4t | 4t | 6t | $\frac{1}{2}$t | $\frac{3}{2}$t |
| 3 | 4t | 7t | 4t | 7t | 2t | 6t | 8t | 14t | $\frac{3}{4}$t | $\frac{9}{4}$t |
| 4 | 8t | 15t | 8t | 15t | 2t | 8t | 8t | 22t | $\frac{5}{4}$t | $\frac{14}{4}$t |
| 5 | 16t | 31t | 16t | 31t | 4t | 12t | 8t | 30t | $\frac{7}{4}$t | $\frac{21}{4}$t |
| 6 | 32t | 63t | 16t | 47t | 8t | 20t | 8t | 38t | 3t | $\frac{33}{4}$t |
| 7 | 64 | 127t | 16t | 13t | 16t | 36t | 8t | 46t | 4t | $\frac{49}{4}$t |
| 8 | 128t | 255t | 16t | 79t | 32t | 68t | 8t | 54t | 6t | $\frac{73}{4}$t |
| 9 | 256 | 511t | 16t | 95t | 64t | 132t | 8t | 62t | 9t | $\frac{109}{4}$t |
| 10 | 512t | 1023t | 16t | 111t | 64t | 196t | 8t | 70t | 14t | $\frac{165}{4}$t |

NON-VOLATILE SEMICONDUCTOR MEMORY DEVICE USING SUCCESSIVELY LONGER WRITE PULSES

BACKGROUND OF THE INVENTION

1. Field of the Invention

The present invention relates generally to a nonvolatile semiconductor memory device and, more particularly, to an EEPROM capable of electrically erasing the storage data and rewriting the data.

2. Description of the Prior Art

A non-volatile semiconductor memory device capable of electrically erasing the storage data and rewriting new data is known as an EEPROM (Electrically Erasable Programmable Read Only Memory). This EEPROM does not require, unlike an EPROM (Erasable Programmable Read Only Memory), the use of ultraviolet rays when erasing stored data. The EEPROM is therefore capable of electrically erasing and rewriting the data as it remains mounted on a printed wiring board. For this reason, the EEPROM is easy to use and available for a variety of control devices and memory cards.

In a great majority of EEPROMs which have been presently developed, a MOS transistor including a floating gate is employed as a memory cell. A threshold level is varied depending on whether or not electrons are injected into this floating gate, thereby holding "0" and "1". These floating gate type MOS transistors are arrayed in matrix, and the data written to the memory cells are made readable. For this purpose, it is required that control be effected to converge the threshold levels at a predetermined voltage in at least one status of "0" or "1".

This conduces to problems in the form of an excess erase inherent in the NOR type EEPROM and in the form of an excess write inherent in the NAND type EEPROM. A wide variety of methods of solving these problems have been proposed up to now. One of them is a bit-by-verify method. This method is fully disclosed in a paper for 1990 Symposium on VLSI Circuits (pp. 105–106). However, the easy-to-write and hard-to-write degrees differ depending on the memory cells. The time till all-bit writing is completed is rate-determined by the hard-to-write memory cells. There resultantly arises a problem in which the write time becomes longer.

SUMMARY OF THE INVENTION

It is a primary object of the present invention to provide a non-volatile memory capable of reducing a write time by eliminating the defects described above.

According to the present invention, there is provided a non-volatile semiconductor memory device comprising:

writing means for writing data in a non-volatile memory cell in response to a write pulse;

readout means for reading out data stored in the memory cell; and verification means for verifying to ensure that normal writing has been completed by reading data from the memory cell after each writing;

wherein said writing means can vary writing time, and at least in a part of a sequence of repeating writing unless a normal writing can be confirmed by said verification means, said writing means set writing time longer for the next writing than that for one writing.

According to the present invention, an upper limit of an after-the-write cell threshold level can be decreased well down to a small value with a less number of writing actions than in the prior art because of effecting the write for a longer write time to the non-volatile memory cell where rewriting is needed as a result of a verify process. This leads to a reduction in the entire write time including a step-up time, a discharge time and even a verify time as well as to an increase in writing speed.

BRIEF DESCRIPTION OF THE DRAWINGS

Other objects and advantages of the present invention will become apparent during the following discussion in conjunction with the accompanying drawings, in which:

FIG. 4 is an explanatory circuit diagram showing writing actions in the embodiment of this invention;

FIG. 5 is a sectional view of an element, showing how data "0" is written;

FIG. 6 is a sectional view of the element, showing how data "1" is written;

FIG. 17 is a Table of logical values in the second embodiment of the present invention;

FIG. 18 is a circuit diagram illustrating gates for realizing the Table of logical values;

FIG. 21 is a table for listing write pulses in the respective embodiments;

DESCRIPTION OF THE PREFERRED EMBODIMENT

The present invention will hereinafter be described by way of embodiments where a NAND type EEPROM is employed with reference to the drawings.

The NAND type EEPROM, when writing and erasing the data, unlike a conventional NOR type memory cell, does not require an injection of hot electrons. Since writing and erasing are performed with the aid of tunnel effects, an amount of current flowing in memory cells is therefore small. Accordingly, the data are rewritable on the basis of page mode cycle. Thus, the application thereof extends to not only the memory cards but also hard discs.

Figure 1:
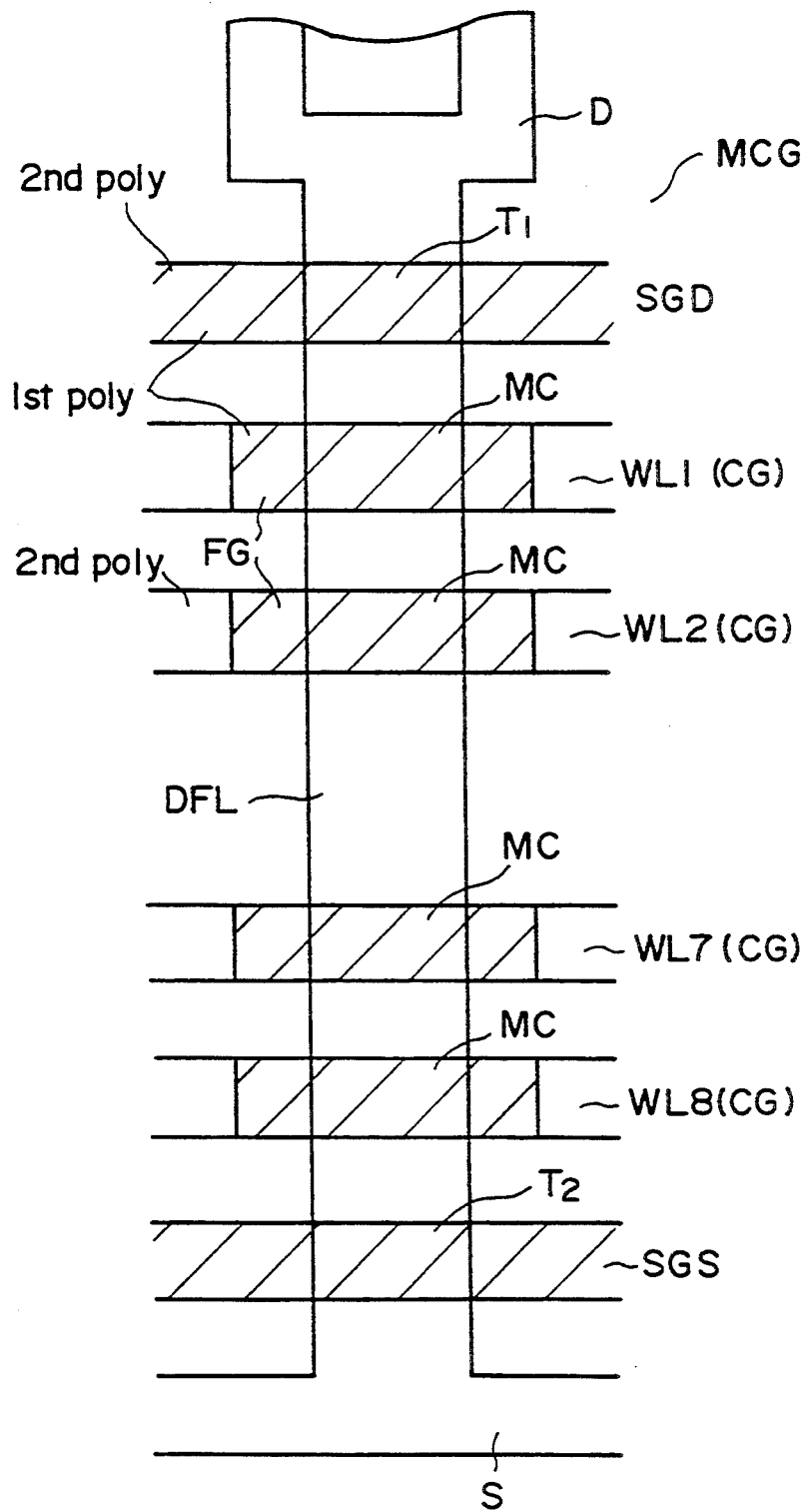
FIG. 1 is a plan view showing a construction of a memory device to which the present invention is applied.

FIG. 1 illustrates one memory cell group MCG of the NAND type suited to such a larger capacity. FIG. 1 is a plan view showing the memory cell group. This NAND cell group is constructed in a P-type well formed in an n-type substrate. FIG. 1 illustrates eight pieces of memory cells MC each having a floating gate FG composed of 1st-layer polysilicon (1st. poly) and control gates (CG, WL1–WL8) composed of 2nd-layer polysilicon (2nd. poly). At drain side D and source side S of these eight NAND memory cells MC, selection transistors T1 and T2 are provided, respectively. A symbol DfL represents a diffused layer.

Next, the operation of this memory cell will be explained.

Figure 2:
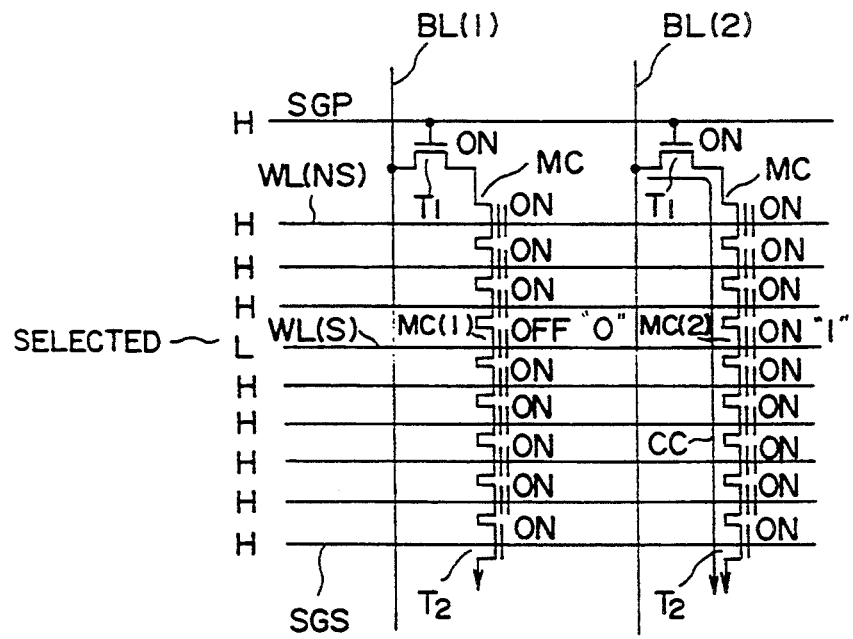
FIG. 2 is a circuit diagram showing the construction of a memory device to which the present invention is applied.

FIG. 2 is a circuit diagram illustrating an equivalent circuit of the memory cell groups MCG in FIG. 1, wherein two pieces of NAND-structure memory cell groups MCG(1) and MCG(2) are shown. During the reading process, a selector gate (word line WL(S)) of the selected memory cells (MC(1). MC(2)) is set at a low level (hereinafter abbreviated to "L"). Selector gates (word lines WL (NS)) of the remaining seven memory cells of the NAND cell group are each set at a high level (hereinafter abbreviated to "H"). A gate (select line SL1) of the select transistor T1 and a gate (select line SL2) of the select transistor T2 are set at "H".

Figure 3:
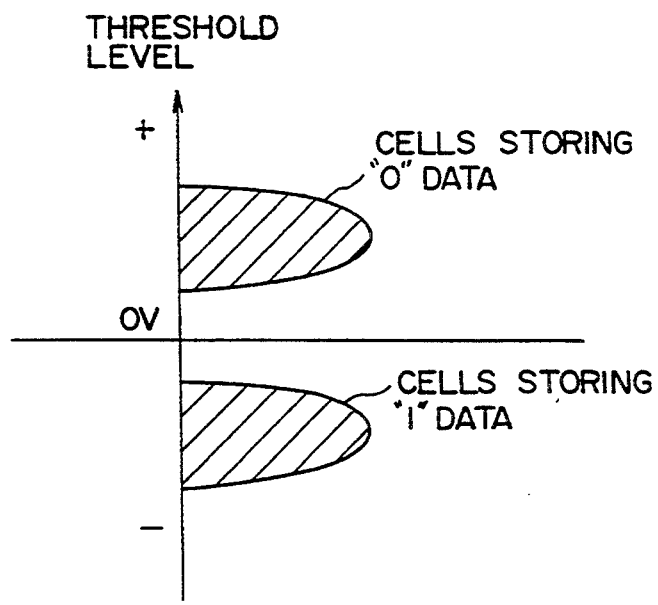
FIG. 3 is a graphic chart showing distribution of threshold levels for two levels.

In a NAND-structure non-volatile semiconductor device, as shown in FIG. 3, threshold voltages of the memory cells to each of which "0" data is written distribute in positive region. Besides, the threshold voltage of the "0" data cell thereof is set to a value smaller than a gate voltage ("H") of a non-selected transistor of the NAND cell group. For this reason, if the threshold voltage of the selected memory cell (MC(1)) is positive (if "0" data is written thereto), no current flows between a bit line (BL(1)) and GND, whereby the bit line (BL(1)) assumes a high level. Further, if the threshold voltage of the selected memory cell (MC(2)) is negative (if "1" data is written thereto), a cell current CC flows between a bit line (BL(2)) and GND. The bit line (BL(2)) thereby assumes a low level. Hence, electric potentials of these bit lines (BL(1), BL(2)) are detected by a sense amplifier. It is thus possible to read whether the data of the target memory cells MC(1), MC(2) are "0" or "1".

The following is an explanation of the writing operation.

As illustrated in FIG. 4, a low decoder supplies a selector gate WL(S) of the selected memory cell with a high voltage (Vpp) on the order of 20 V. Further, seven other selector gates (WL(NS)) are supplied with an intermediate potential (VPI) on the order of 10V. At this time, a gate voltage (SL1) of the select transistor T1 is set at 12 V. Set at 0 V is a gate voltage of the select transistor T2 between the NAND cell group MCG and a source line. Though not illustrated, selector gates of other NAND cell groups are supplied with 0V. When the bit line BL(1) is set at 0 V in this status, a potential difference between the selector gate (WL(S)) of the selected memory cell MC(1) and a channel becomes 20V. Therefore, as shown in FIG. 5, the electrons are injected into the floating gate from the substrate only in the selected memory cell MC(1).

At this moment, since the potential difference between the selector gate and the channel becomes 10 V in seven other memory cells of the same NAND cell group MCG(1), the electron injection into the floating gate does not take place. Further, when the electron injection into the selected memory cell MC(2) is not conducted, i.e., when "1" is to be written, as shown in FIG. 6, a voltage of VDPI may be supplied to the bit line BL(2). The data of "0" or "1" can be written in this manner.

Next, an erasing operation will be explained.

Figure 7:
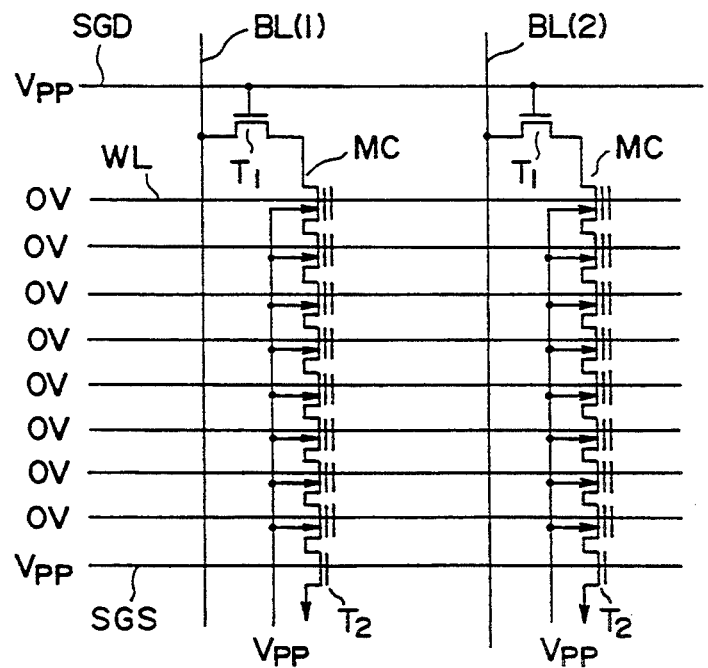
FIG. 7 is an explanatory circuit diagram showing how the data is erased.
Figure 8:
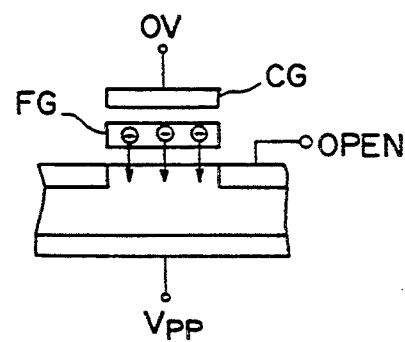
FIG. 8 is a sectional view of the element, showing how the data is erased.

As depicted in FIG. 7, during the erasing action, the substrate is set at approximately 20 V (Vpp), while the selector gate is set at 0 V. The electrons are thereby, as illustrated in FIG. 8, pulled out of the floating gate into the substrate, thus effecting the erase. At this time, the select lines SL1, SL2 are set at 20 V (Vpp) to relieve a gate stress of the selector gate.

As described above, in the NAND-structure EEPROM, the writing action is performed by a tunnel current. Hence, the current running through the memory cells when written is very small. Writing can be therefore effected simultaneously to several hundreds through several thousands of memory cells.

Subsequently, a bit-by-verify operation will be explained. The above-mentioned floating gate type memory cell has a scatter in terms of writing characteristic. The NAND-structure EEPROM is not exceptional.

Figure 9:
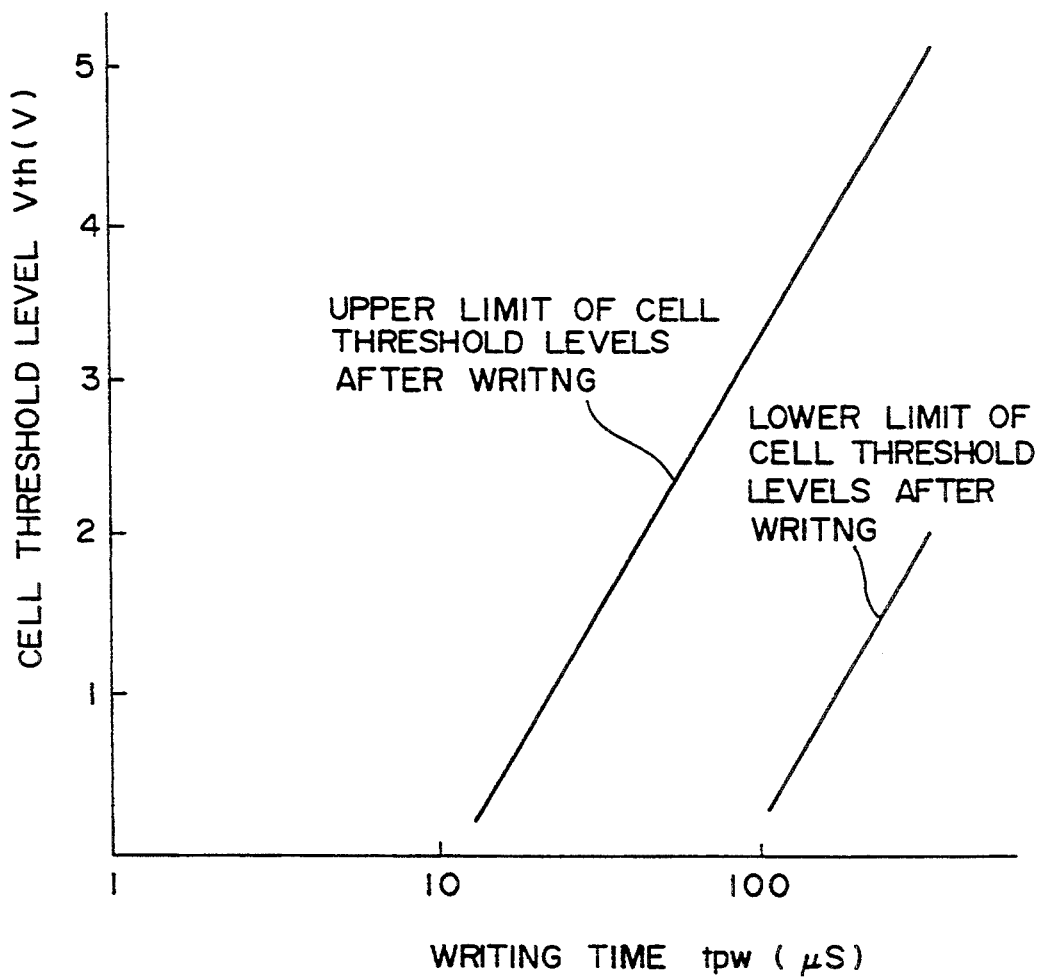
FIG. 9 is a graphic chart illustrating a write characteristic.

FIG. 9 shows a relationship between a write time tpw and a cell threshold level Vth when writing "0" to a "1" cell. According to this relationship, an after-the-write cell threshold level exhibits a dispersion on the order of about 3 V between a faster writing cell and a slower one on the basis of the same write time. Accordingly, when written by the first write pulse, it is quite difficult to restrain a distribution of the after-the-write cell threshold levels Vth in a narrow range. The write time is subdivided in the bit-by-verify process to perform the following steps: writing reading rewriting to only incorrectly written cells reading rewriting to only incorrectly written cells . . .

Figure 10:
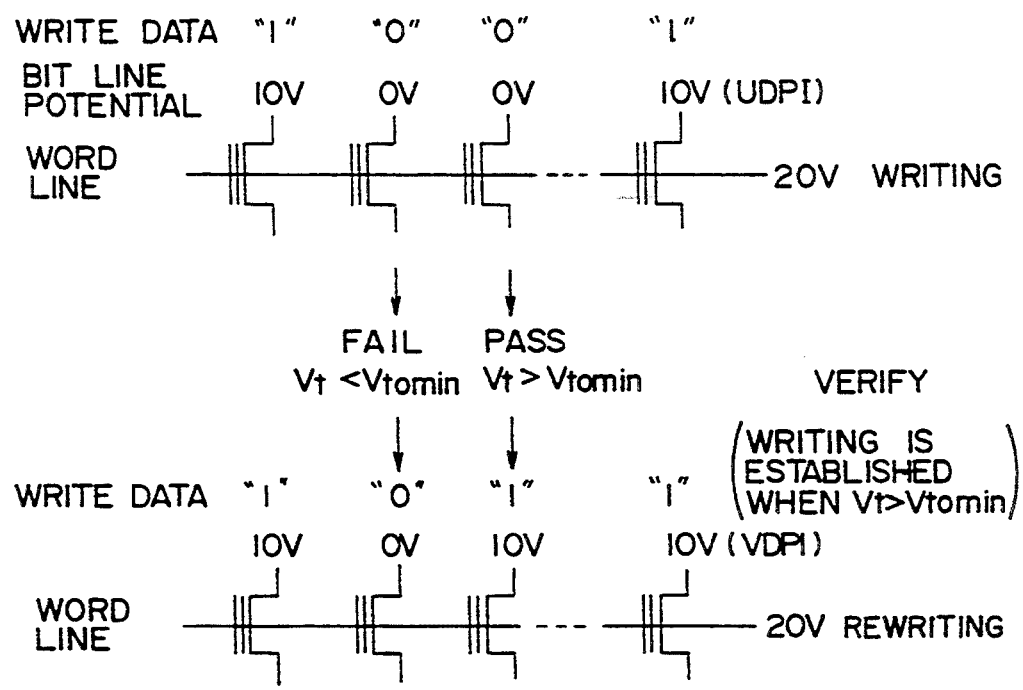
FIG. 10 is an explanatory diagram showing a bit-by-verify process.

This will be explained referring to FIG. 10. The writing actions to all the memory cells connected to the single word line are simultaneously conducted. At this time, the data to be written are sequenced such as "1", "0", "0", . . . "1" from the left column. Hence, the data are written (positive shift of threshold level) to the memory cells in the second column, the third column .

.. Subsequently, a verify process (reading) is executed. At this time, whether the threshold level is greater than a predetermined voltage Vt0min or not is judged. If greater than this voltage, and when sufficiently written, the action is a pass. Whereas if smaller than the predetermined voltage Vt0min, and when insufficiently written, the action is a fail. Subsequently, rewriting of only the fail bits is effected. A shift width ΔVth of the threshold voltage is determined by a pulse width. The shift width ΔVth becomes smaller with a shorter pulse width, and the vice versa. The threshold levels of the memory cells are converged at a given narrow threshold distribution by applying a plurality of short write pulses little-by-little. The circuit according to this invention is herein characterized by an arrangement wherein the write pulse width is elongated gradually according to the second time, the third time and so on. The EEPROM in this embodiment has an autoprogramming mode in which these actions are automatically conducted.

Given next is an explanation of a configuration of the circuit, characteristic of the present invention, for controlling the writing action.

Figure 11:
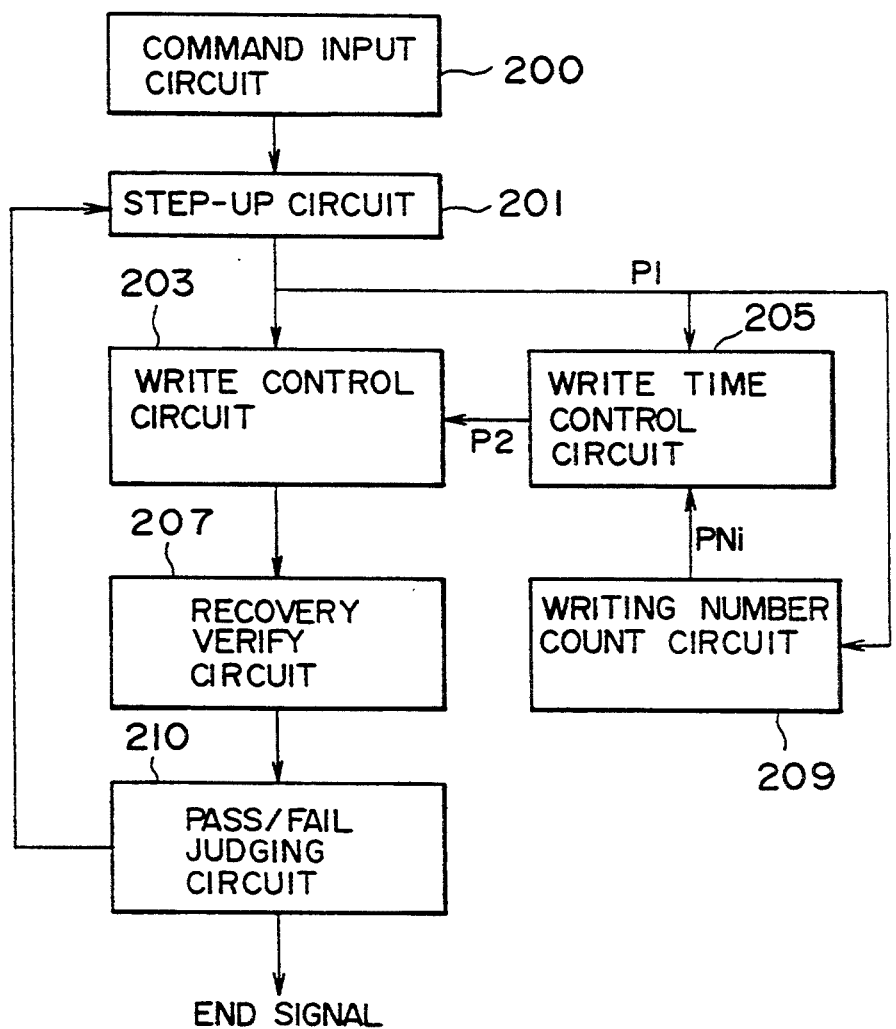
FIG. 11 is a block diagram illustrating a first embodiment of the present invention.

FIG. 11 illustrates a configuration of circuit blocks relative to the writing action. More specifically, the circuit blocks are constructed of a command input circuit 200, a step-up circuit 201, a write control circuit 203, a write time control circuit 205, a writing number count circuit 209, a recovery verify circuit 207 and a pass/fail judging circuit 210. The command input circuit 200 starts the writing action by decoding a write command inputted from the outside. The step-up circuit 201 generates a high voltage required for the write. The write control circuit 203 controls applications of a variety of voltages to memory arrays after receiving a write start pulse P1 subsequent to the end of the step-up action. The write time control circuit 205 transmits a write end pulse P2 to the write control circuit 203. The writing number count circuit 209 counts the number of writing actions. The recovery verify circuit 207 rereads the data from the write cells after the writing action has been done. The pass/fail judging circuit 210 judges whether or not the readout data are correctly written. The autoprogramming mode is actualized by these circuit blocks.

Figure 12:
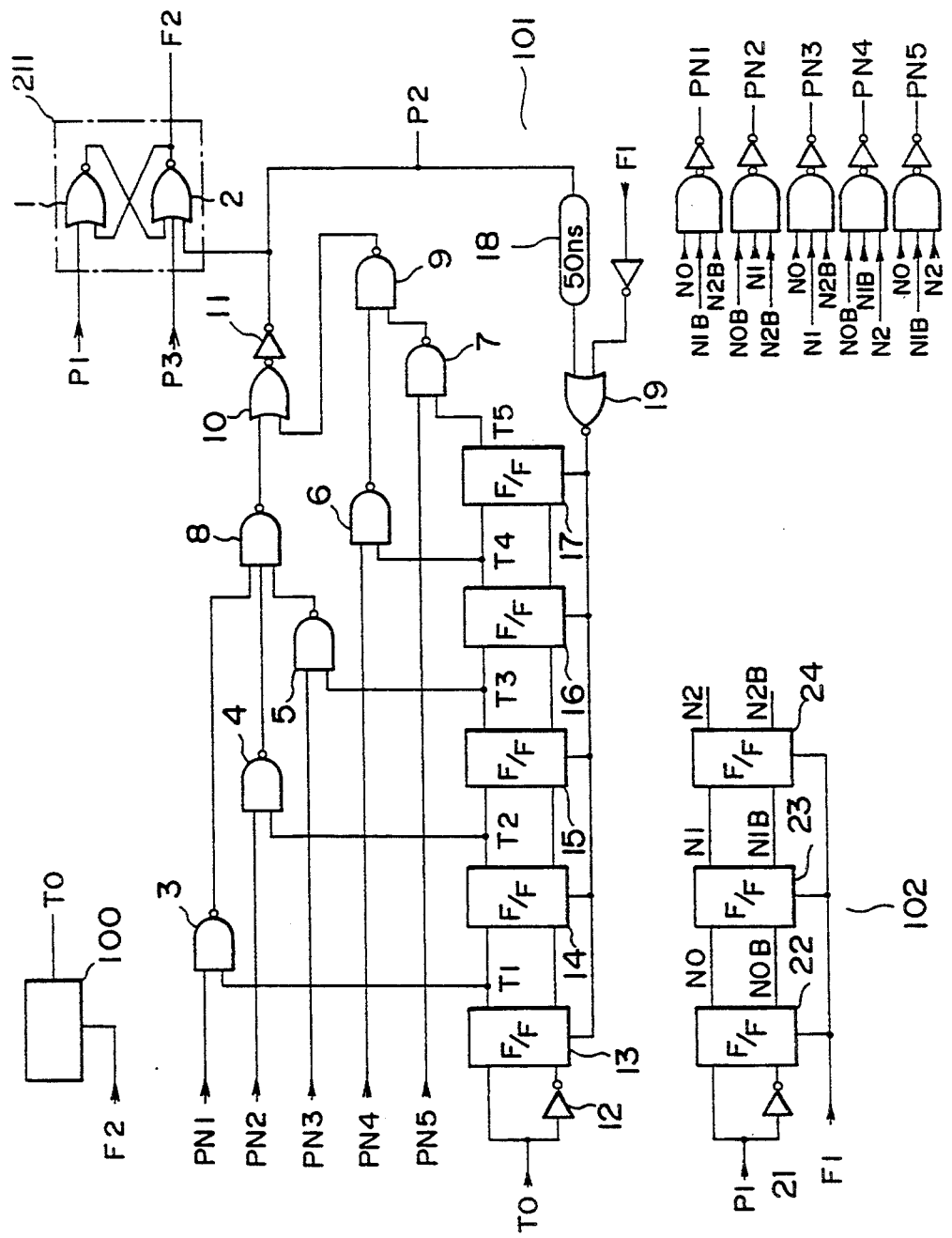
FIG. 12 is a circuit diagram illustrating the detailed construction of a part of construction illustrated in FIG. 11.

FIG. 12 shows particulars of the write time control circuit 205 and the writing number count circuit 209. This write time control circuit 205 consists mainly of an oscillator 100 and a timer 101. The writing number count circuit 209 consists chiefly of a writing number count part 102 and a writing number decoding part 103.

The oscillator 100 is constructed of an oscillation circuit composed of a ring oscillator or the like and a counter. An enable signal F2 works during only a period of "H", and a square wave having a pulse width T/2 is outputted with a period T to a node T0.

The timer 101 is constructed of flip-flops 13–17, gates 3–11 for outputting signal in response to writing time and a latch circuit 211 for outputting a writing signal in response to output signal of the gates.

The latch circuit is comprised of two NOR gates 1 and 2 and a write start pulse signal P1 is applied as a set signal and a power supply start up pulse signal P3 is applied as a reset signal.

The flipflop 13 has two inputs of input clock signal T0 and its inverted signal by an inverter 12. The output signal thereof is applied to an input of the next stage. The Same relations are applicable for the following stages. The NAND gate 3 inputs the signal PN1 and the output signal of the flipflop 13. Similarly, output signals of the flipflops 14 17 and the input signals PN2–PN5 are supplied to inputs of NAND gates 4–7, respectively. The output signals of the NAND gates 3–5 are supplied to inputs of the NAND gate 8, similarly the output signals of NAND gates 6 and 7 are supplied to inputs of the NAND gate 9. The output signals of the NAND gates 8 and 9 are supplied to inputs of the NAND gate 10. The output signal thereof is inverted by an inverter 11 to form signal P2. This signal P2 is a reset input signal of the latch circuit 211 and is delayed by a delay element 18 to input a NOR gate 19. At the other input, an enable signal F1 inverted by an inverter 20 is supplied, and the output signal of the NOR gate 19 becomes a reset signal given to the flipflops 13–17.

The writing number count part 102 is a binary counter constructed by three stage flipflops 22–24 to which the enable signal F1 is supplied as the reset signal. The writing number decoding part 103 has a plurality of NAND gates to which a predetermined combination of output signals of the inverters 22–24 to form input signals PN2–PN5 for the timer 101.

The operation of this timer circuit is now explained.

Writing is effected while the output signal F2 assumes "H". Namely, the pulse width of the signal F2 corresponds to the write time tpw. The flip-flops 13–17 constitute an asynchronous binary counter and are operable by the enable signal F1 assuming the "H" level during the writing operation. Outputs T1–T5 vary at falls of input clock signals T0. The NAND gates 3–8 select any of the outputs T1–T5 of the binary counter in response to input signals PN1–PN5, thereby generating the write time end pulse P2. The delay circuit 18 determines a pulse width of the write time end pulse P2. The write time end pulse P2 works to reset the latch circuit 211.

The writing number count part 102 is composed of a binary counter and this binary counter asynchronously counts the number of writing operations at falls of the write start pulses P1. Herein, the symbol NOB designates an inverted signal of NO. The enable signal F1 assumes "H" when entering the autoprogramming mode. The binary counter is reset at a fall of this signal.

Figure 13:
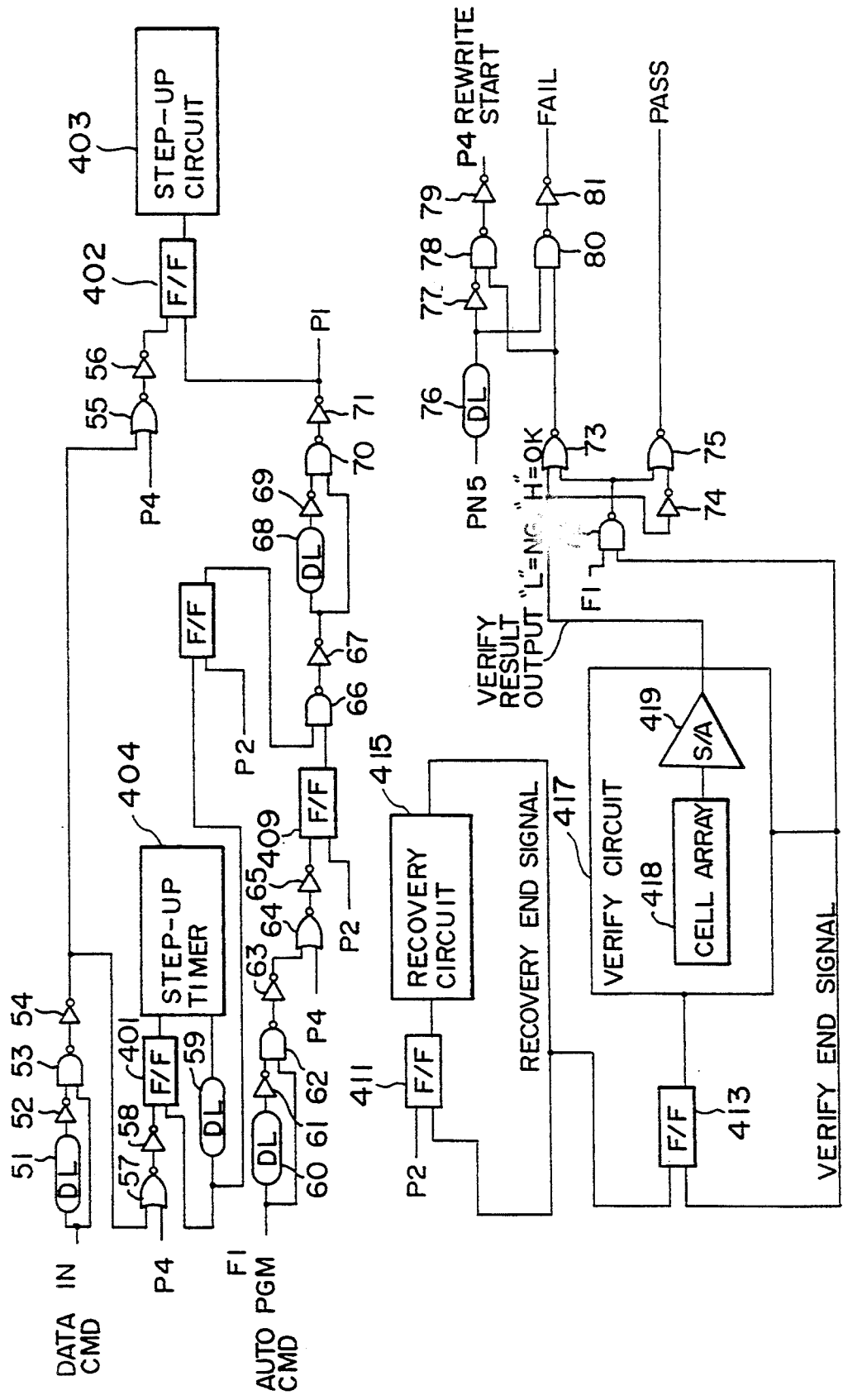
FIG. 13 is a circuit diagram illustrating a variation of the construction illustrated in FIG. 11.

FIG. 13 shows an example where the circuit block shown in FIG. 11 is made of a gate-level-based construction and autoprogramming is actualized.

A signal DATAIN CMD which becomes "H" in a data take-in mode (where one-word line data are taken in an internal latch) is applied to a NAND gate 53 as it is. This signal is also supplied to the other input of the NAND gate 53 with being delayed by a delay element 51 and inverted by an inverter 52. The NAND gate 53 outputs a pulse having a predetermined duration and this pulse is inverted by an inverter 54 and supplied to a NAND gate 55. At the other input of the NAND gate 55, the rewrite start pulse P4 is supplied. The output signal of the NAND gate 55 is inverted by an inverter 56 and supplied to an input of a flipflop 402.

The output signal of the inverter 54 and the rewrite start pulse P4 are supplied to inputs of a NAND gate 57, and after the output signal of the NAND gate 57 being inverted by an inverter 58, it is supplied to an input of a flipflop 401. The output signal of this flipflop 401 is given to a step-up timer 404. The output signal of this timer 404 is delayed by a delay element 59 then supplied to the flipflop 404 as a reset input signal and also supplied to a flipflop 407.

The AUTOPGM CMD signal F1 is supplied to one input of the NAND gate 62 as it is and is also supplied to the other input of the NAND gate 62 with delayed by a delay element 60 and inverted by an inverter 61. The output signal of the NAND gate 62 is inverted by an inverter 63 and supplied to an input of a NAND gate 64. The rewrite start pulse P4 is supplied to the other input of the NAND gate 64 and the output thereof is inverted by an inverter 65 and supplied to a flipflop 409. The write time end pulse P2 is supplied to the other input of the flipflop 409. The output signals of the flipflop 407 and 409 are supplied to inputs of a NAND gate 66. The output signal of the NAND gate is inverted by an inverter 67, then supplied to an input of a NAND gate 70 as it is and to the other input with delayed by a delay element 68 and inverted by an inverter 69. The inverted output signal of the NAND gate 70 is the write start pulse signal P1 which is also supplied to the flipflop 402 as a reset signal.

The write end signal P2 is supplied to a recovery circuit 415 through a flipflop 411, with the output signal thereof being fedback to the flipflop 411. The output signal of the recovery circuit 415 is also supplied to a flipflop 413, and the output signal of the flipflop 413 is applied to a verify circuit 417. A verify end signal which is output from the verify circuit 417 is supplied to the other side of the flipflop 13 and is supplied to a NAND gate 72 with the signal F1. Further, a verify result output signal and the output signal of the NAND gate 72 are supplied to a NOR gate 73, an inverted verify result output signal inverted by an inverter 74 and the output signal of the NAND gate 72 are supplied to a NOR gate 75. The output signal of the NOR gate 75 becomes a PASS signal. The output signal of the NOR gate 73 is delayed by a delay element 76 and supplied to a NAND gate 80 with a PN5 signal delayed by a delay element 76. The output signal of the NAND gate 80 is inverted by an inverter 81 to form a FAIL signal. The output signal of the delay element 76 is inverted by an inverter 77 and then supplied to a NAND gate 78 with the output signal of the NOR gate 73. The inverted output signal of the NAND gate 78 by an inverter 79 become the rewrite start pulse signal P4.

Figure 14:
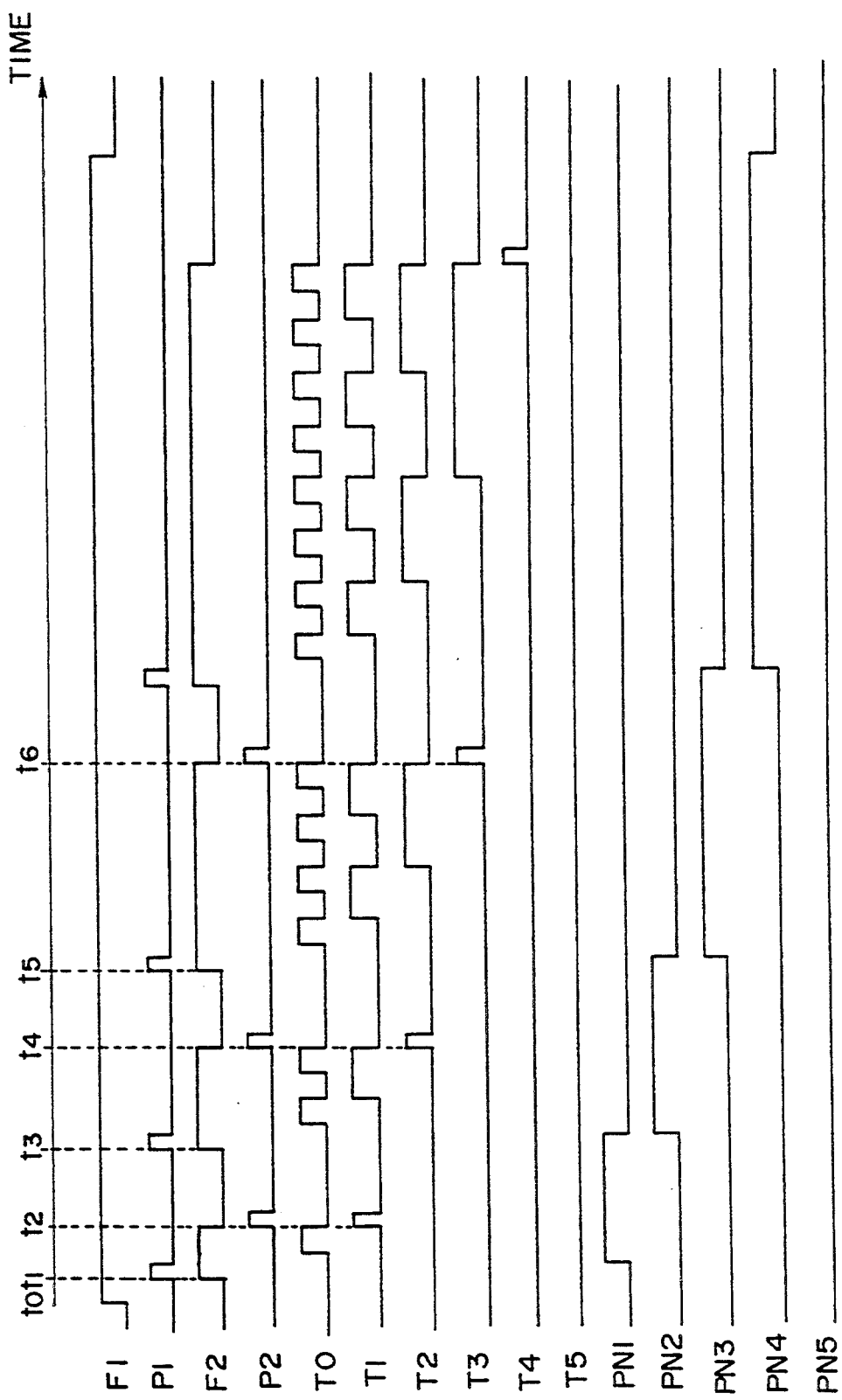
FIG. 14 is a timing chart showing operations of the first embodiment of the present invention.
Figure 15:
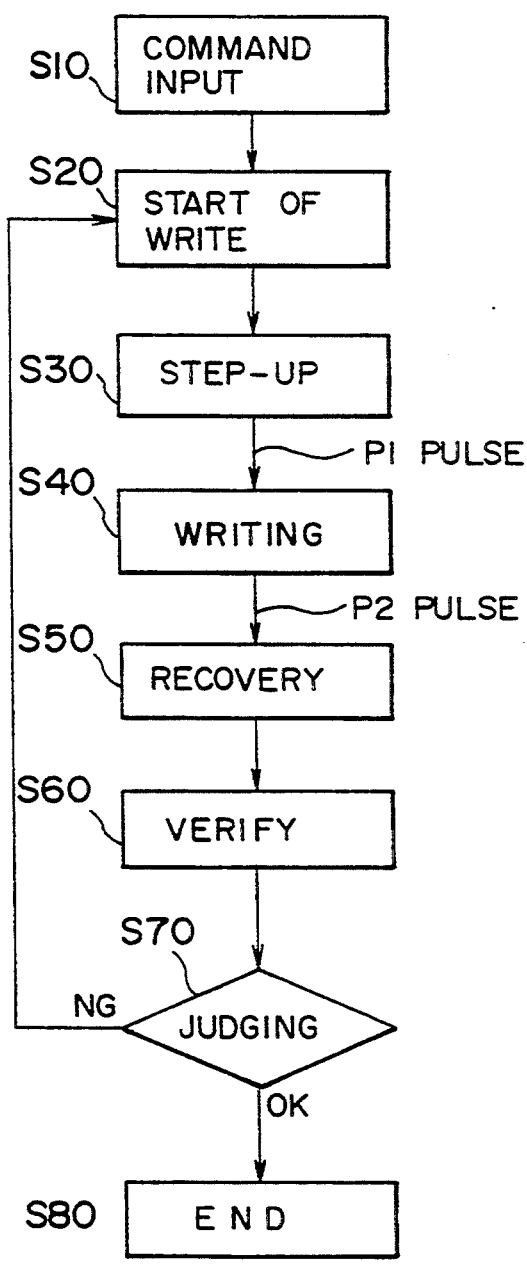
FIG. 15 is a flowchart showing the first embodiment of the present invention.

The operations of the circuits illustrated in FIGS. 12 and 13 will hereinafter be described with reference to a time chart of FIG. 14 and a flowchart of FIG. 15. The signal F1 has fallen at the end of writing of the last time, and therefore, the flip-flops 13, 14, 15, 16, 17, 22, 23, 14 are all reset. Accordingly, T1, T2, T3, T4, T5 and N0, N1, N2 all become "L". In this status, the data input command is given from the outside (step S10). When the signal DATAIN CMD assumes "H", flip-flops 401, 402 are set, thereby starting the writing action (step S20). Subsequently, a step-up circuit 403 consisting of a charge pump circuit and a step-up timer 404 are actuated. When the step-up circuit 403 proceeds the step-up to a write voltage (20 V, 10 V) necessary for the program, the step-up timer 404 is timed out. (step S30). Simultaneously, the flip-flop 401 is reset, while the flip-flop 407 is set.

In parallel thereto, the autoprogram command is inputted from the outside at a timing t0, whereby the signal F1 assumes "H". Then, the flip-flop 409 is set. When both of the flip-flops 407, 409 are set at the timing t0, the write start pulse P1 is generated. The flip-flop 22 is set in accordance with this write start pulse P1, and N0 becomes "H". At the same time, the latch circuit 211 is set, and F2 assumes "H", thereby starting the write.

Simultaneously with this, the oscillator 100 is actuated, and the pulse T0 having a period T is outputted. After T seconds have elapsed from the timing t1, i.e. when the potential of T0 falls at a timing t2, the flip-flop 13 is set, and T1 becomes "H". This writing action is the first time, and hence PN1 is at "H". Accordingly, the NAND gate 3 outputs "L". As a result of this, a pulse on the order of 50 ns is generated in P2. The P2 pulse is fallen by resetting the flip-flops 13, 14, 15, 16, 17 through the delay circuit 18. This pulse P2 works to reset the latch circuit 211, and the signal F2 falls, thus finishing the first writing action (step S40). A writing time tw1 at this time is equal to the oscillation period T of the oscillator 10. Herein, a value of the oscillation period T generally ranges from several $\mu$s to several tens of $\mu$s.

Subsequently, the pulse P2 sets a flip-flop 411, and a recovery circuit 415 operates (step S50). When the recovery action is ended, a recovery end signal is outputted to reset the flip-flop 411 and set a flip-flop 413. Consecutively, a verify circuit 417 starts operating (step S60). The verify action is, as explained above, to compare a content written to the cell with a content of the data to be written. More specifically, the writing actions to the one-word line cells (approximately 2000 cells) are conducted simultaneously. Hence, the data of the memory cells for the one-word line are reread and compared with the data contents of the write data latches (corresponding to the number of bit lines). If all contents are coincident, "H" (OK) is outputted as an output of verify result. Whereas if even one of the contents is not coincident, "L" (NG) is outputted (step S70). Further, simultaneously with this, the write data are latched by the write data latches with respect to the cells (insufficiently written cells) to which the data are to be written next. If the output of verify result is "L", rewriting is effected. Hereat, the write start pulse P4 becomes "H".

When the pulse P4 assumes "H", the slip-flop 401 is set. In consequence of this, the flip-flops 401, 402, 409 are set. Actuated subsequently are the step-up circuit 403 consisting of the charge pump circuit and the step-up timer 404. The step-up timer 404 is timed out when the step-up circuit 403 proceeds the step-up to a write voltage (20 V, 10 V) required for the program. With this action, the flip-flop 401 is reset, while the flip-flop 407 is set. When both of the flip-flops 407, 409 are set at the timing t3, the write start pulse P1 is generated. The flip-flop 22 performs a toggle action in accordance with this write start pulse P1. NO becomes "L", while NOB assumes "H". The binary counter 102 counts up 1. At the same time, the latch circuit 211 is set, and F2 becomes "H". Then, writing is started.

Simultaneously with this, the oscillator 100 is actuated, and the pulse T0 having the period T is outputted. After 2 T seconds have passed from the timing t3, viz., when the potential of T0 rises at a timing t4, the flip-flop 14 is set; and T2 assumes "H". This writing action is the second time, and, therefore, PN2 is at "H". Accordingly, the NAND gate 4 outputs "L". As a result, the pulse on the order of 50 ns is generated in P2. This pulse P2 works to reset the latch circuit 211. The signal F2 is fallen, thus ending the second writing action. The writing time tw2 at this time is equal to a 2-fold oscillation period T of the oscillator 100.

Similarly, the write pulse of the third time turns out 4 T that is 4 times as large as that of the first time, and the write pulse of the fourth time turns out 8 T that is 8 times that of the first time. As discussed above, the write pulse can be made longer with the latter writing action by providing the writing number counter and the circuit for counting the write time with the aid of the oscillator.

Given next is a description of another embodiment of the present invention, wherein the write pulse is generated by discharging of a CR circuit.

Figure 16:
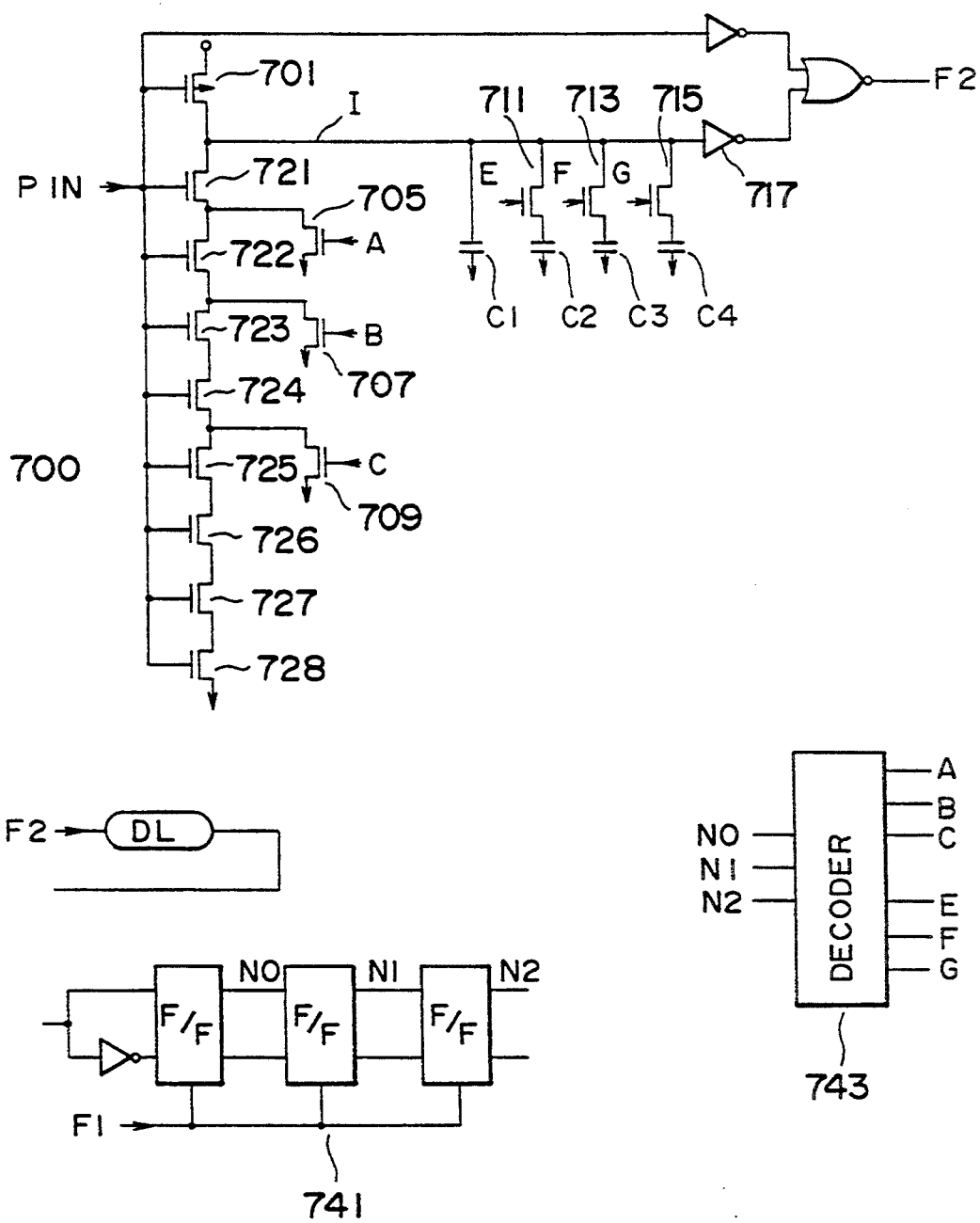
FIG. 16 is a circuit diagram illustrating a second embodiment of the present invention.

FIG. 16 shows an example of the write time control circuit. This circuit is constructed of a MOS variable resistance circuit 700, a binary counter circuit 741 and a decoder 743. A P-channel transistor 701 is connected in series to eight pieces of N-channel transistors 721–728. An input terminal Pin is connected to all the gates. A drain of the P-channel transistor 701 serves as an output of the MOS variable resistance circuit 700. The transistors 722, 723 are grounded via the transistor 705. The transistors 724, 725 are grounded via the transistor 709. A capacitor C1 is connected to the output of the MOS variable resistance circuit 700. Capacitors C2–C4 are connected thereto via the transistors 711, 713, 715. An inverter 717 is also connected to the output terminal of the MOS variable resistance circuit. The decoder 743 drives the gates of the respective transistors by decoding the output of the binary counter circuit 241. A capacitance ratio of C1 : C2 : C3 : C4 is predetermined as 1 : 1 : 2 : 4. The transistors 721–728 have the same size (W/L). Further, it is presumed that each of the transistors 705, 707, 709, 711, 713, 715 have greater current driving capabilities than those of the transistors 721–728.

FIG. 17 is a Table of logical values of the decoder 743. FIG. 18 shows how this is actualized by means of NAND gates and NOR gates. Peripheral circuits are substantially the same as those in the embodiment discussed above and are therefore omitted.

Subsequently, the operation of the circuit shown in FIG. 16 will be explained. During the first writing action, the binary counter 741 is all reset by the signal F1. As a result, decoded signals A, BC become "H", while signals E, F, G assume "L". When the signal Pin is at "L", the P-channel transistor 701 is turned on. This is a precharge status, and electric charges are accumulated in the capacitor C1. Subsequently, when the signal Pin rises to "H", the electric charges accumulated in the capacitor C1 are discharged via the transistors 721, 705. Herein, a resistance value of discharge path is determined by the transistor 721. Discharging is effected in this manner for T seconds during the first writing action. An output of the inverter 717 rises from "L" to "H". Then, the T-second pulse is outputted to F2 after Pin has risen. Subsequently, the binary counter 741 is incremented by 1 in preparation for the second writing action.

During the second writing action, the signals A, B, C, E become "H", while the signals F and G assumes "L". When the signal Pin is at "L", the P-channel transistor 701 is turned on. In this precharge status, the electric charges are accumulated in the capacitors C1, C2. Subsequently, when the signal Pin rises to "H", the electric charges accumulated in the capacitors C1, C2 are discharged via the transistor 721, 705. Herein, the resistance value of the discharge path is, as in the case of the first writing action, determined by the transistor 721. A quantity of electric charged to be discharged is, however, doubled. Hence, the discharge takes place for 2 T seconds in the second writing action. Then, a 2 T-second pulse is outputted to F2 after Pin has risen. Subsequently, the binary counter 741 is incremented by 1 in preparation for a third writing action.

During the third writing action, the signals A, B, C, E, F assume "H", whereas the signal G becomes "L". When the signal Pin is at "L", the P-channel transistor 701 is turned on. In this precharge status, the electric charges are accumulated in the capacitors C1, C2, C3. Subsequent to this step, when the signal Pin rises to "H", the electric charges accumulated in the capacitors C1, C2, C3 are discharged via the transistors 721, 705. Herein, the resistance value of the discharge path is, as in the case of the first writing action, determined by the transistor 721. The quantity of the electric charges to be discharged is, however, quadrupled. Hence, the discharge takes place for 4 T seconds in the third writing action. Then, a 4 T-second pulse is outputted to F2 after Pin has risen subsequently, the binary counter 741 is incremented by 1 in preparation for a fourth writing action.

During the fourth writing action, the signals A, B, C, E, F, G all assume "H". When the signal Pin is at "L", the P-channel transistor 701 is turned on. In this precharge status, the electric charges are accumulated in the capacitors C1, C2, C3, C4. Subsequent to this step, when the signal Pin rises to "H", the electric charges accumulated in the capacitors C1, C2, C3, C4 are discharged via the transistors 721, 705. Herein, the resistance value of the discharge path is, as in the case of the first writing action, determined by the transistor 721. The quantity of the electric charges to be discharged is, however, quadrupled. Hence, the discharge takes place for 8 T seconds in the third writing action. Then, a 8 T-second pulse is outputted to F2 after Pin has risen. Subsequently, the binary counter 741 is incremented by 1 in preparation for a fifth writing action.

During the fifth writing action, the signal A becomes "L", while the signals B, C, E, F, G assume "H". When the signal Pin is at "L", the P-channel transistor 701 is turned on. In this precharge status, the electric charges are accumulated in the capacitors C1, C2, C3, C4. Subsequent to this step, when the signal Pin rises to "H", the electric charges accumulated in the capacitors C1, C2, C3, C4 are discharged via the transistors 721, 722, 707. Herein, the resistance value of the discharge path is determined by the transistors 721, 722. The quantity of the electric charges to be discharged is equal to that of the fourth time. The resistance value in the discharge path is, however, doubled. Hence, the discharge takes place for 16 T seconds in the fifth writing action. Then, a 16 T-second pulse is outputted to F2 after Pin has risen. Subsequently, the binary counter 741 is incremented by 1 in preparation for a sixth writing action.

During the sixth writing action, the signals A, B assume "L", while the signals C, E, F, G assume "H". When the signal Pin is at "L", the P-channel transistor 701 is turned on. In this precharge status, the electric charges are accumulated in the capacitors C1, C2, C3, C4. Subsequent to this step, when the signal Pin rises to "H", the electric charges accumulated in the capacitors C1, C2, C3, C4 are discharged via the transistors 721, 722, 723, 724, 709. Herein, the resistance value of the discharge path is determined by the transistors 721, 722, 723, 724. The quantity of the electric charges to be discharged is equal to that of the fourth time. The resistance value in the discharge path is, however, quadrupled. Hence, the discharge takes place for 32 T seconds in the sixth writing action. Then, a 32 T-second pulse is outputted to F2 after Pin has risen. Subsequently, the binary counter 741 is incremented by 1 in preparation for a seventh writing action.

During the seventh writing action, the signals A, B, C assume "L", while the signals E, F, G assume "H". When the signal Pin is at "L", the P-channel transistor 701 is turned on. In this precharge status, the electric charges are accumulated in the capacitors C1, C2, C3, C4. Subsequent to this step, when the signal Pin rises to "H", the electric charges accumulated in the capacitors C1, C2, C3, C4 are discharged via the transistors 721, 722, 723, 724, 725, 726, 727, 728. The quantity of the electric charges to be discharged is equal to that of the fourth time. The resistance value in the discharge path is, however, octupled. Hence, the discharge takes place for 64 T seconds in the sixth writing action. Then, a 64 T-second pulse is outputted to F2 after Pin has risen.

As described above, it is possible to obtain the outputs having difference pulse widths by combining the MOS variable resistance circuit 700 and the variable capacitance circuit. In particular, as shown in the embodiments, the capacitance ratio is set such as C1 : C2 : C3 : C4 ... =1 : 1 : 2 : 4 ... : and the resistance value of the discharge path is set such as 1 : 2 : 3: 4 ..., thereby making it possible to generate the multiplied pulses. For instance, C1 is set to 1 pF (area 660 $\mu m^2$ and a thickness of oxide film is 250 angstroms), C2 is set to 1 pF, C3 is set to 2 pF, and C4 is set to 4 pF. Further, when W/L of the transistors 721–728 connected in series and employed as resistance elements is set to 5/80, a value of T becomes 1 $\mu s$. Hence, the widths of the write pulses are 1 $\mu s$, 2 $\mu s$, 4 $\mu s$, 8 $\mu s$, 16 $\mu s$, 32 $\mu s$, 64 $\mu s$.

Another embodiment of this invention has been described as above, wherein the write pulses are generated by discharging of the CR circuit. However, this write pulse generation circuit is, as a matter of course, usable widely generally in the form of a pulse generation circuit as well as in the non-volatile semiconductor memory device.

Figure 19:
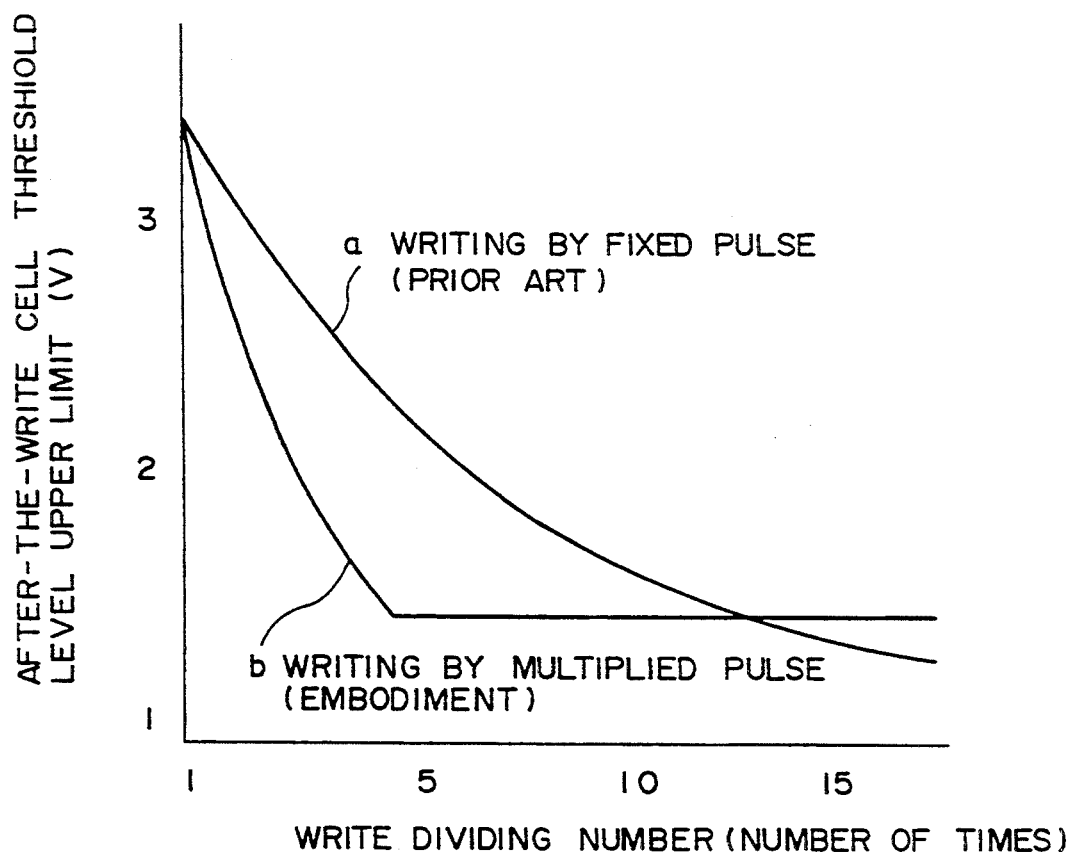
FIG. 19 is a graphic chart showing advantageous effects of the present invention.

FIG. 19 shows the effects of the two embodiments discussed above. FIG. 19 shows an after-the-write cell threshold level distribution upper limit versus a write division number, wherein a curve a indicates writing by the fixed pulses, and a curve b indicates writing by the multiplied pulses in accordance with the embodiments of the present invention. In the conventional example, the upper limit of the cell threshold level can be reduced as the number of divisions becomes larger. In accordance with the embodiments of the present invention, if the number of divisions exceeds 5, the limit exists in the easy-to-write cells because of the fact that the write time is doubled each time. The upper limit of the threshold level is saturated at a certain point. Seeing it within a range of 10 times, i.e., the practical number of times, however, there can be performed such writing that the upper limit of the threshold level is restrained well down to a small value with the number of times as small as 5 in the embodiments of this invention as compared with the conventional example. Further, in accordance with this embodiment, an excess write is not conceived as a very serious problem. It is because the cells which are unwritable for the first and second writing actions are originally the hard-to-write cells.

As explained above, when using the device according to the present invention, the threshold level upper level of the after-the-write cells can be reduced well down to the small value with the less number of writing operations than in the conventional example. This leads to a reduction in the total write time including the step-up time, the discharge time and even the verify time as well as to an increase in the write speed.

Figure 20:
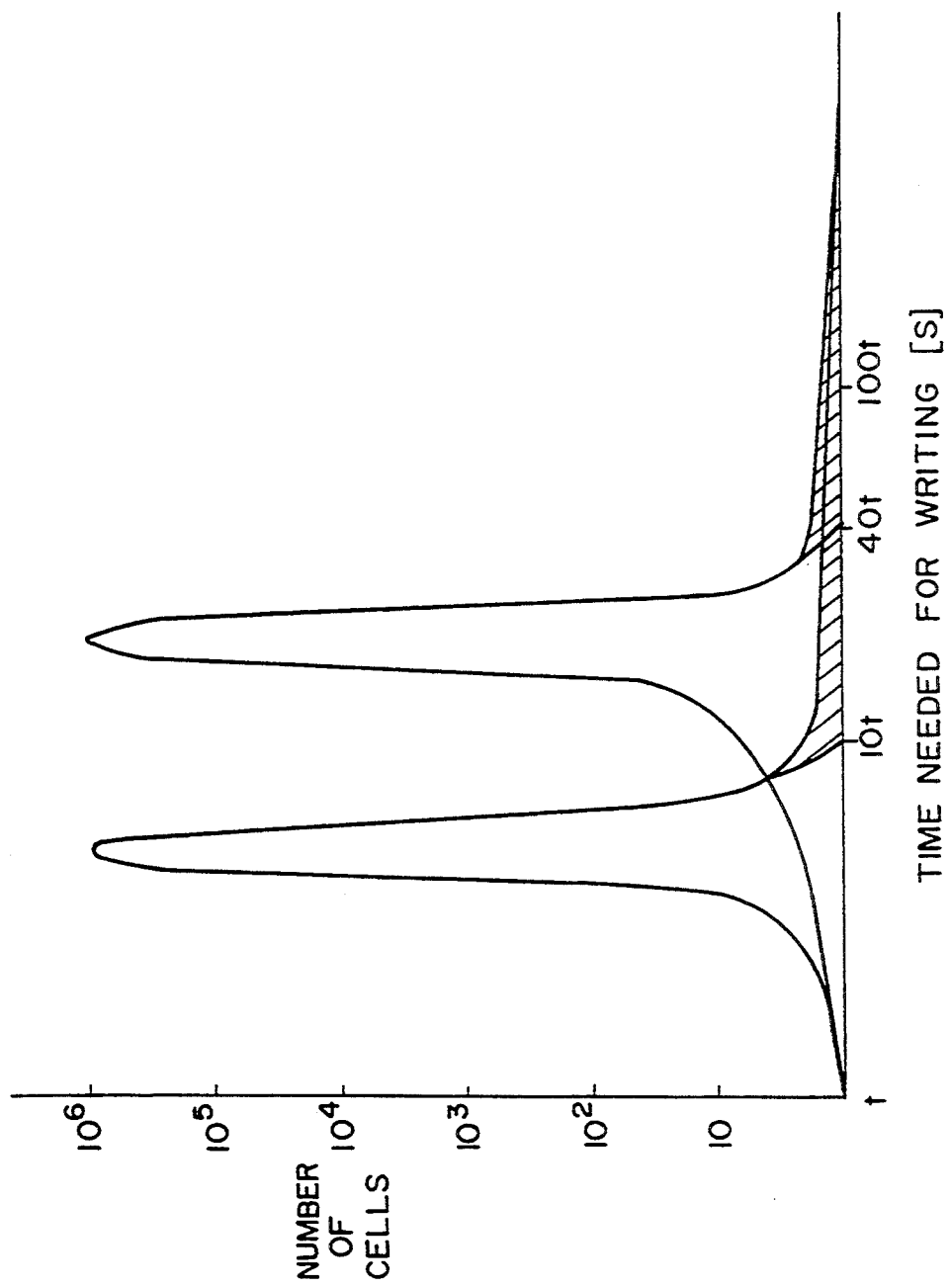
FIG. 20 is a graphic chart illustrating a distribution of the time needed for writing.

FIG. 20 shows a cell frequency distribution versus a write time, wherein T is the fastest cell write time. It is assumed that the fastest cell write time T is so controlled at the manufacturing stage as to be always fixed by changing the process conditions.

As can be known from FIG. 20, the time required for writing within a lot or a wafer generally varies in a 10-times to 40-times range. Further, as indicated by oblique lines in FIG. 20, the normal distribution may spread over 100 times in a skirted form.

In accordance with the first and second embodiments, higher-speed writing than in the conventional example is attained so as to be possible of corresponding to a case where the cell write time is distributed in such a form. The write pulse width, however, increases while raising it to the nth power of two. Hence, for example, the pulse width of the sixth time becomes as large as 32 T. If the cell distribution versus the time needed for the write is limited to the 40-fold range, the writing action is ended sixth time. The last 20 T-pulse of the sixth time leads to a futile write time. This results in an increase in terms of a mean write time.

Supposing that, for instance, the cell distribution for the time necessary for the write is limited to a substantially 40-times range; and the cell having the write time 50 T is the latest even in consideration of a dispersion, the mean write time can be shorter than in the embodiment 1 by effecting the next writing action only when dispersed over 47 T as well as by setting the power equal after the fifth time. This is accomplished in an embodiment 3 which is explained later.

Further, a slope of the curve in FIG. 9 represents a variation in the cell threshold level with respect to an increment in the write time. A dispersion of this value is seen between chips. If this value increases, and when the write time extends over the originally required write time, there exists a high probability in which the cell threshold level rises in excess of the expected value. It is presumed that a total of the write pulse widths up to, e.g., the nth time is more than twice the write pulse width up to the last time. It then follows that the write time increases twice the original write time in the nth writing action with respect to the cells that do not exceed the very limit of judgement level in the last writing action. At this time, if a variation in the cell threshold level is large for the increment in the write time shown in FIG. 9, there exists a possibility that such a cell threshold level may exceed an allowable upper limit. This implies lessening an action allowance with respect to the power supply voltage during the reading action. It is therefore required that the after-the-write cell threshold level be controlled to fall within as narrow distribution width as possible. This is of importance especially in the EEPROM having a power supply voltage of 3.3 V. Therefore, the effective way of obviating the problem described above is to avoid an abrupt change by varying the write time in a different manner from the first or second embodiment. This is accomplished in embodiments 4–6.

FIG. 21 is a Table where such embodiments 3–6 are arranged with the embodiments 1 and 2. Referring to this Table, in a third embodiment, the power for write pulses is set to 2 for the first 4 times and is set equal after 5th time. In a fourth embodiment, the initial value is set to 2t and the increment is set to 0 from the first time to the fourth time and after the ninth time. Further, in a fifth embodiment, the increment is set to 0 after the third time, where the initial value is 2t. In a sixth embodiment, the accumulated write pulse widths up to the nth time and the accumulated write pulse widths up to the (n+1)th time exhibits a predetermined ratio. The following is a detailed explanation.

Figure 22:
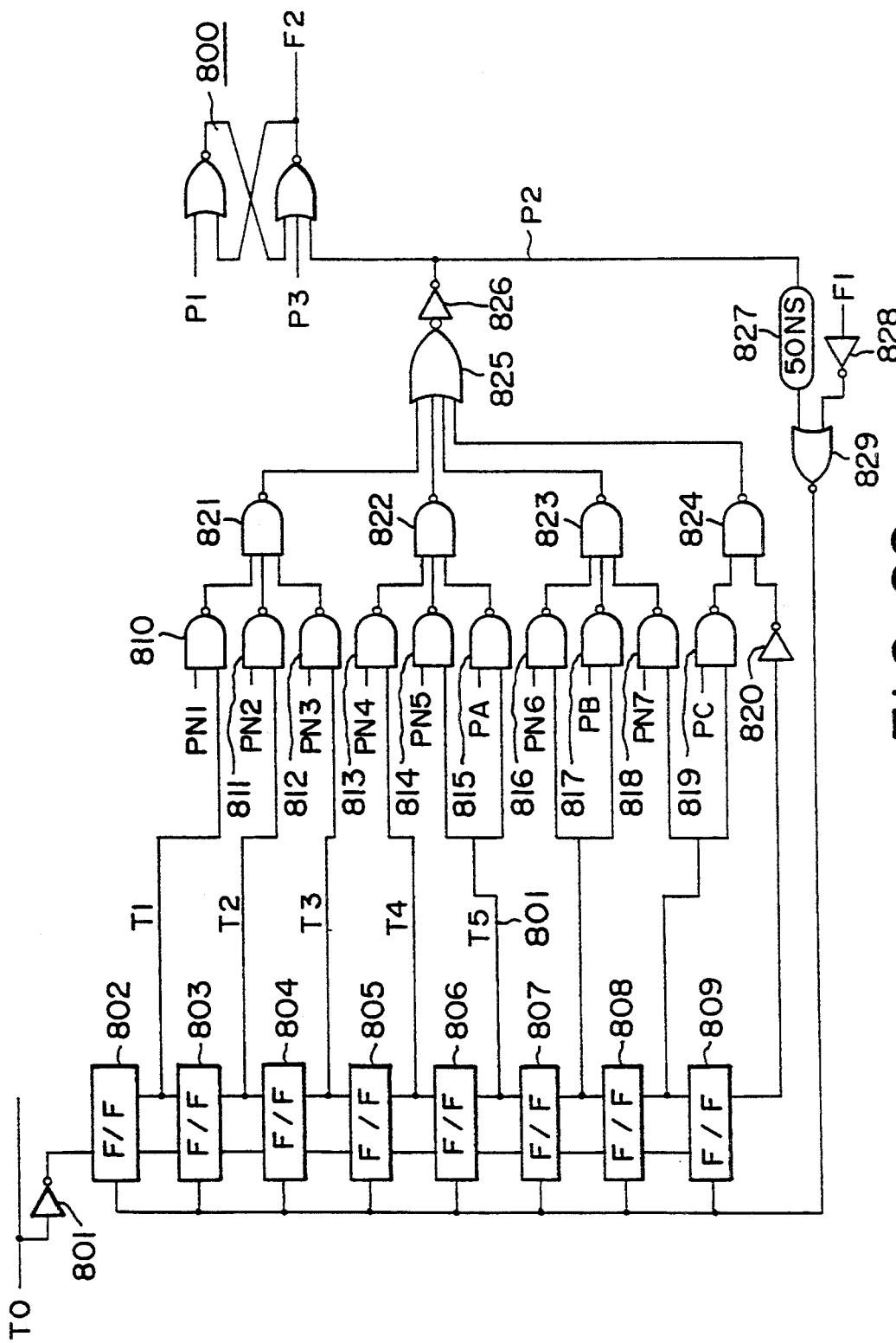
FIG. 22 is a circuit diagram illustrating a third embodiment of the present invention.
Figure 23:
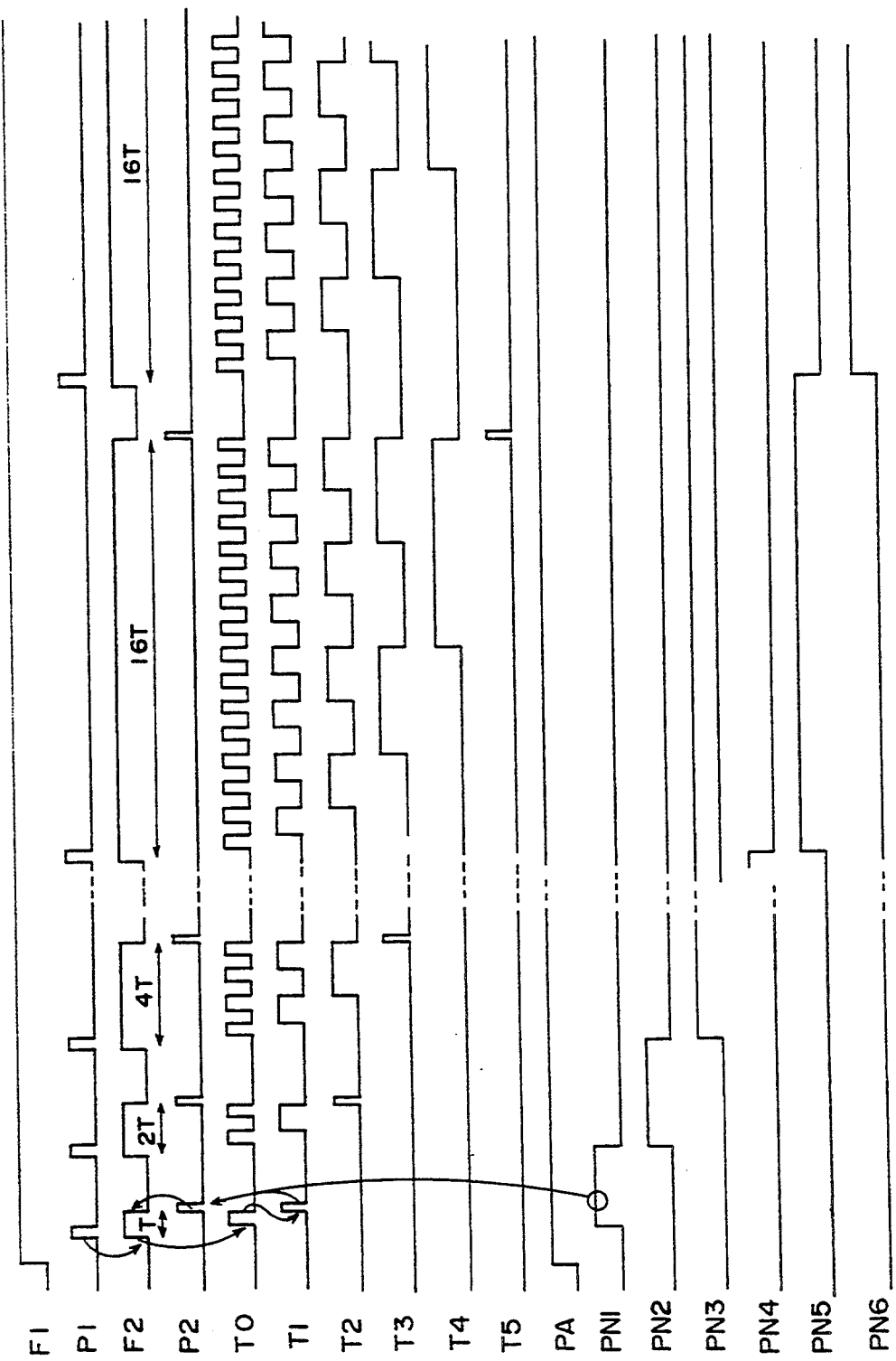
FIG. 23 is a timing chart showing operations in the third embodiment of the present invention.

FIG. 22 is a circuit diagram in the third embodiment. FIG. 23 is a timing chart showing the actions thereof. The third embodiment is arranged such that F2 of the fifth time in the first embodiment is kept as it is after the fifth time. A configuration in FIG. 22 is similar to that shown in FIG. 12, flipflops 802-809 correspond to flipflops 13-17 shown in FIG. 12, logical gates 810-826 to logical gates 3-11 in FIG. 12, and reset means 827-829 to reset means 18-20 in FIG. 12, respectively. A combination of the logic gates is, however, different. Particularly at the fifth through seventh stages, a flip-flop 801 is reset by fixed inputs PA, PB, PC for NAND gates 815, 817, 819.

It is assumed that PA is always at a high level during the writing action. Any of signals PN1 through PN5 obtained by decoding the outputs of the number counter illustrated in FIG. 12 becomes the high level each time writing is performed up to the fifth time. Reset is the flip-flop for outputting the write control signal F2 at the time of a timer output inputted to each NAND gate. The signal PA is at the high level after the sixth time, and, therefore, the flip-flop 801 is reset if the node 801 assumes the high level each time.

Any of PA, PB, PC is set at the high level, while others are set at the low level depending on the way of distribution with respect to the cell write time, thus selecting which time, the fifth or sixth or seventh time, to set the power equal therefrom. PA, PB, PC can be set by use of a fuse or the like. It is thus possible to attain the write control circuit for applying the equal-power write pulses from the nth time by employing the same circuit as that in the first embodiment.

Figure 24:
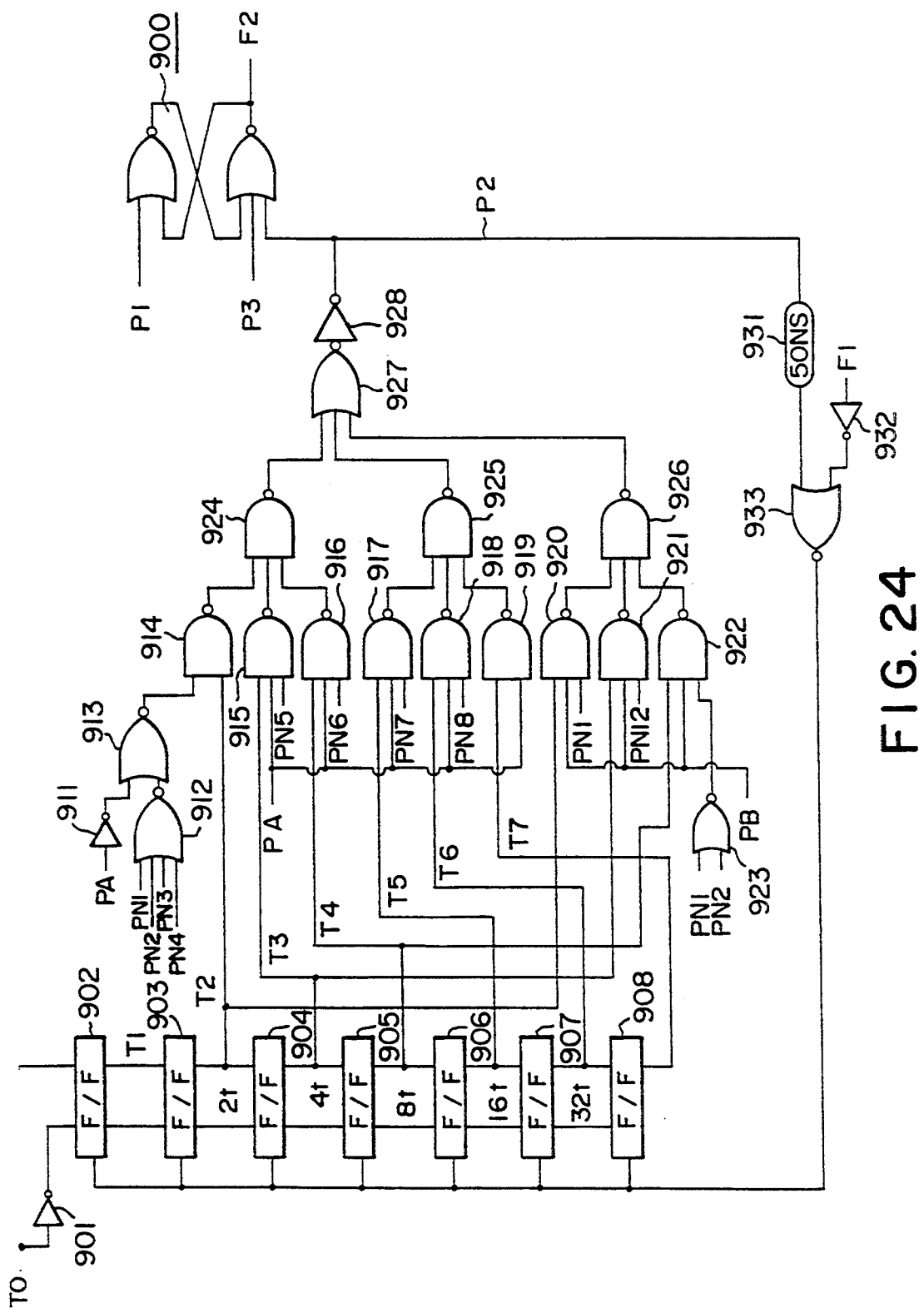
FIG. 24 is a circuit diagram illustrating a fourth embodiment of the present invention.
Figure 25:
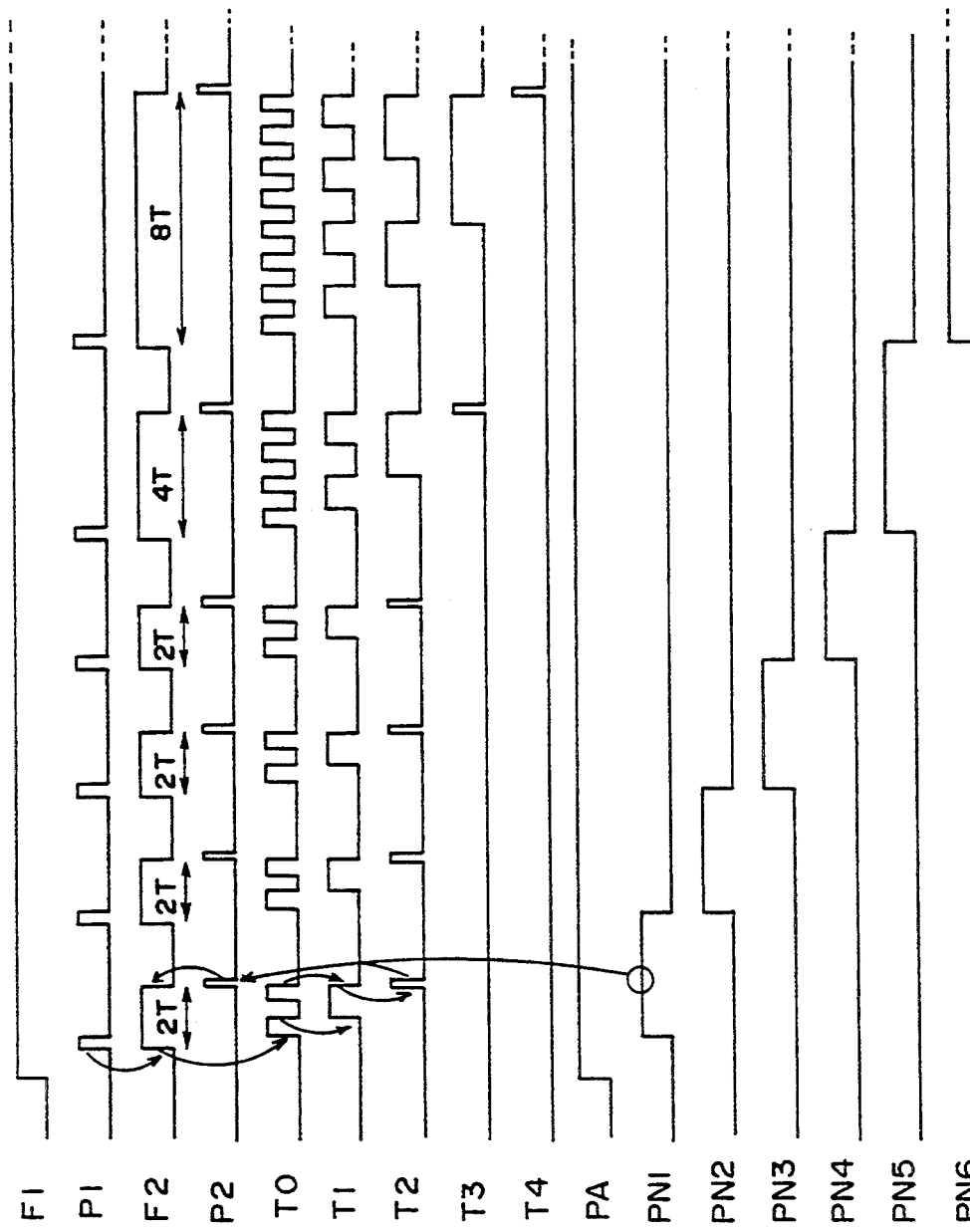
FIG. 25 is a timing chart showing operations in the fourth embodiment of the present invention.

FIG. 24 is a circuit diagram showing a fourth embodiment of the present invention. FIG. 25 is a timing chart showing actions thereof. In this embodiment, for a correspondence to the cell distribution versus the write time, a flip-flop circuit 900 is reset with respect to the inputs of the first time through the fourth time to obtain the same pulse width.

A configuration in FIG. 24 is similar to that shown in FIG. 12. Flipflops 902-908 correspond to flipflops 13-17 shown in FIG. 12, logical gates 911-928 to logical gates 3-11 in FIG. 12, and reset means 931 and 932 to reset means 18-20 in FIG. 12, respectively. A combination of the logic gates is, however, different. In particular, the signal PA is supplied to 3-input NAND gates 915-919, and the signal PB is supplied to 3-input NAND gates 920-922, whereby enabling selection of this method.

Figure 26:
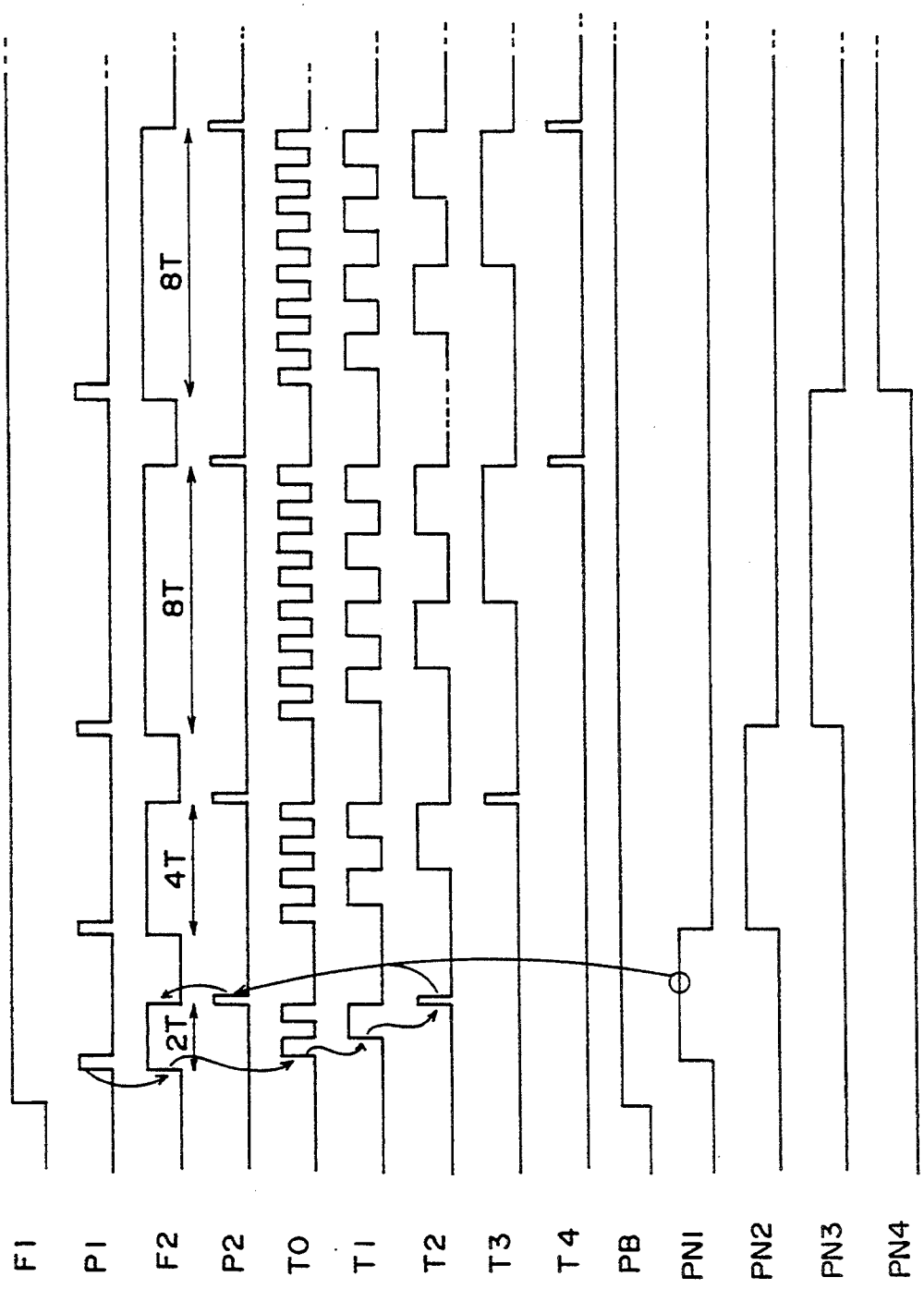
FIG. 26 is a timing chart showing operations in a fifth embodiment of the present invention.

FIG. 26 is a timing chart showing the fifth embodiment.

Operations according to fourth and fifth embodiments are now described.

Figure 27:
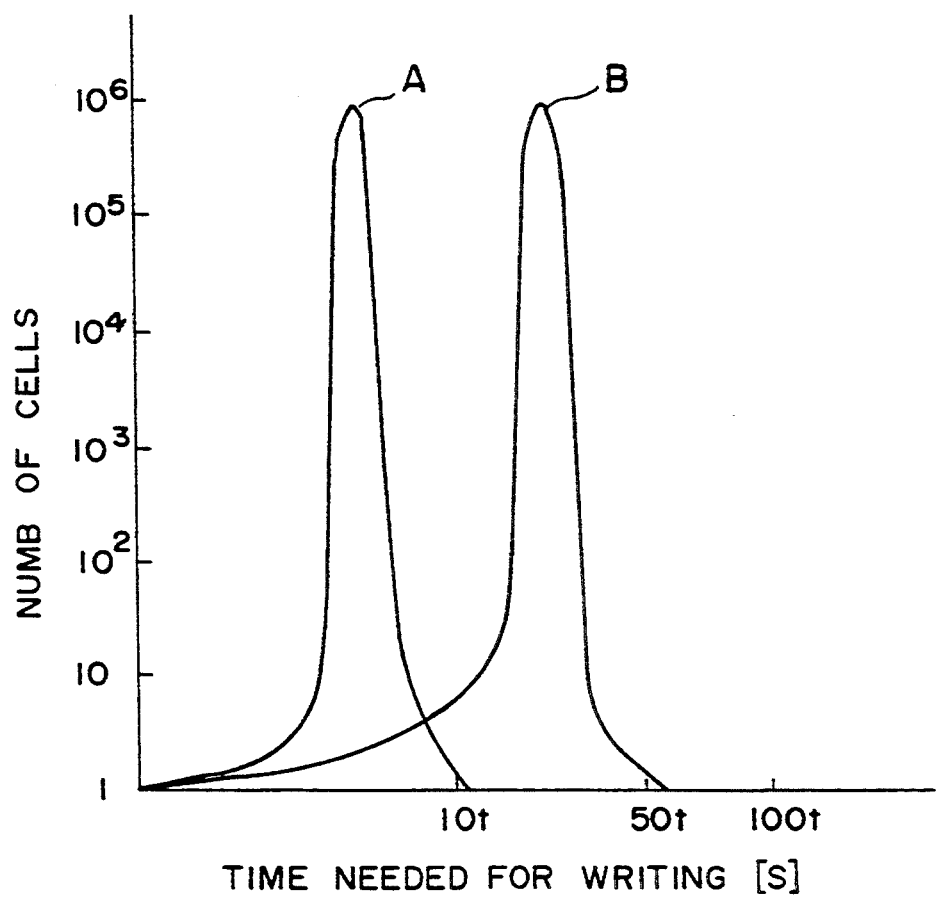
FIG. 27 is a graphic chart illustrating a distribution of the time needed for writing.

FIG. 27 shows a cell frequency distribution versus a write time, wherein T is the fastest cell write time. It is assumed that the fastest cell write time T is so controlled at the manufacturing stage as to be always fixed by changing the process conditions. As shown in FIG. 27, no cell exists apart from the normal distribution in this instance. There are shown two typical distributions A, B each spreading in a substantially 40-times range.

Considered is a case where the writing methods in the embodiment 1 or 3 is applied to this distribution. Writing to all the cells can be done in the fourth writing action with respect to the distribution A. However, a ratio of the total of the write pulse widths up to the nth time to the total of those up to the (n+1)th time is 3 to 2. Consequently, if the slope in FIG. 9 becomes large, a rate of excess write cells increases so much in a range of 4 T to 7 T as a central part of the distribution A.

Further, the after-the-write cell threshold levels can be distributed in a narrow range in the writing action by the equal-power pulses. There is, however, a defect in which the number of writing actions increases enough to extend the write time because of being written to even the slow-to-write cell with a fixed pulse width. The same thing can be applied to the distribution B.

Contrastingly in the embodiment 4, for the case illustrated by the curve A in FIG. 27, if the center of the cell distribution exists in the range up to 10 T, the ratio of the total of the write pulse widths up to the nth time to the total of those up to the (n+1)th time is set to 2 or under by applying the write pulses each having the equal pulse width up to the fourth time. The excess write is thereby eliminated. If the center of the cell distribution exists beyond 10 T as shown in the distribution B, the power of the write pulses is set equal after the fourth time as in the embodiment 5. Writing can be thereby performed with a decreased rate of the excess write cells. In this case, a rate of sum of the write pulses of the first time and those up to the second time is 3. In the distribution B, however, several cells exist in the vicinity thereof. It may be conceived that the excess write cells do not exist in terms of probability.

The fourth and fifth writing methods are switched over by providing the fuse or the like depending on the way of the cell distribution versus the write time. In the case of the distribution A in FIG. 27, PA is set at the high level, while PB is at the low level. Any of PN1, PN2, PN3, PN4 thereby becomes the high level up to the fourth writing action. The timer output T2 therefore assumes the high level, thereby resetting the flip-flop 900. The write pulse turns out a pulse having a time 2 T. After the fifth time, the write pulse turns out the one which increases while raising it to the nth power of two each time as in the first embodiment.

In the case of the distribution B shown in FIG. 27, PB is set at the high level, while PA is at the low level. The write pulses can be set as 2 T- and 4 T-pulses up to the second time but have a fixed pulse width of 8 T after the third time.

In the first through third embodiments, the ratio k of the total of the write pulse widths up to the nth time to the total of those up to (n+1)th time is 2 or larger. Therefore, if the slope shown in FIG. 9 i.e., a variation in the cell threshold level for the increment in the write time takes a large value, it is considered that the after-the-write cell threshold level exceeds a target value.

Contrastingly in the fourth and fifth embodiments, the pulses are set as equal-power pulses in some of the writing actions. The ratio k of the total of the write pulse widths up to the nth time to the total of those up to the (n+1) time is set to 2 or under.

The sixth embodiment is characterized such that the ratio k of the accumulated write pulse widths up to the nth time to the accumulated those up to the (n+1)th time is set to a given value of 2 or less. For instance, the pulse width is raised to the equal power in the first time and the second time but raised to the nth power of two after the third time by means of the circuit used in the embodiment 1. It is thus possible to actualize the circuit by which the ratio k of the total of the write pulse widths up to the nth time to the total of those up to the (n+1)th time is always set to 2.

Figure 28:
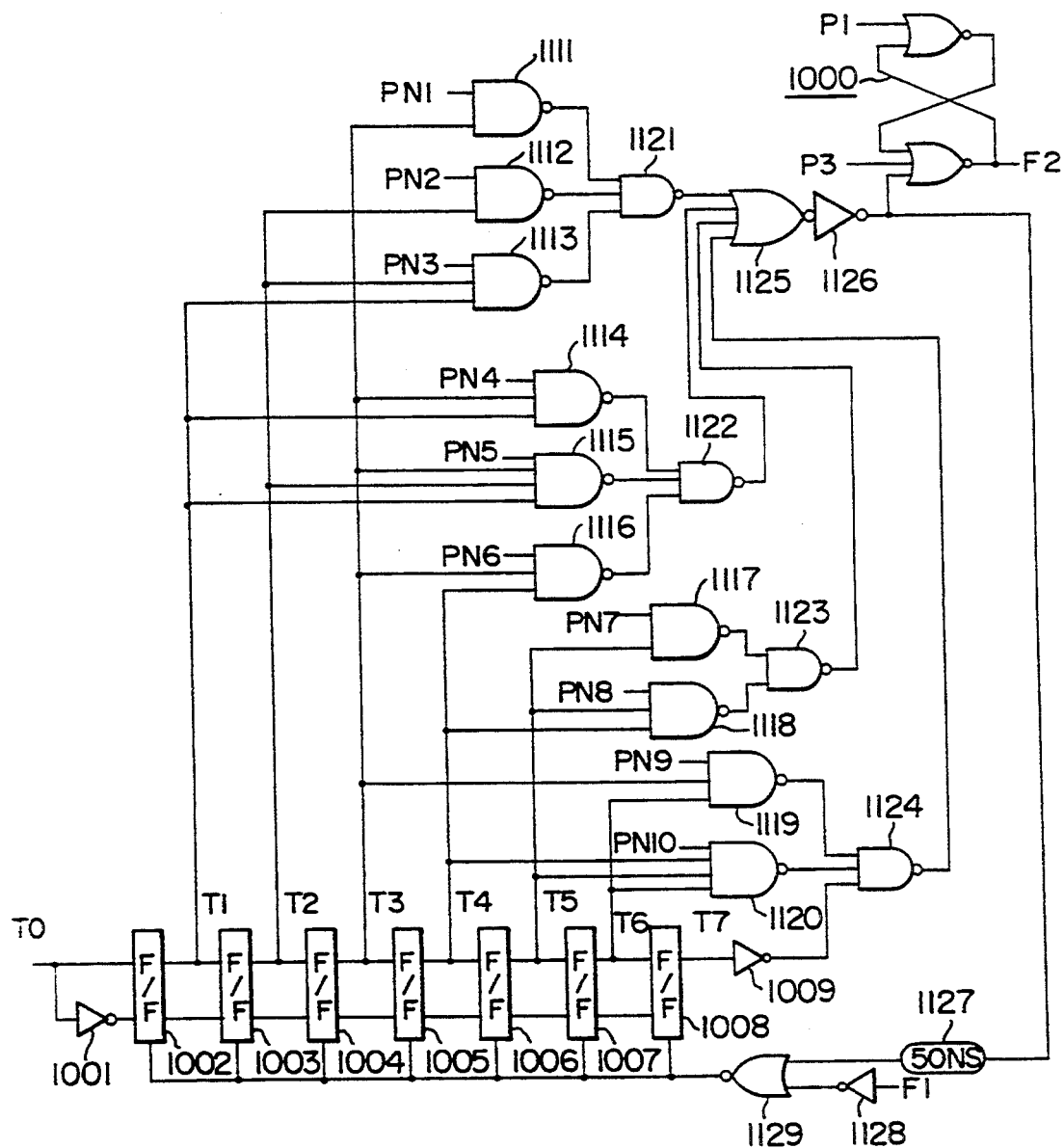
FIG. 28 is a circuit diagram illustrating a sixth embodiment of the present invention.
Figure 29:
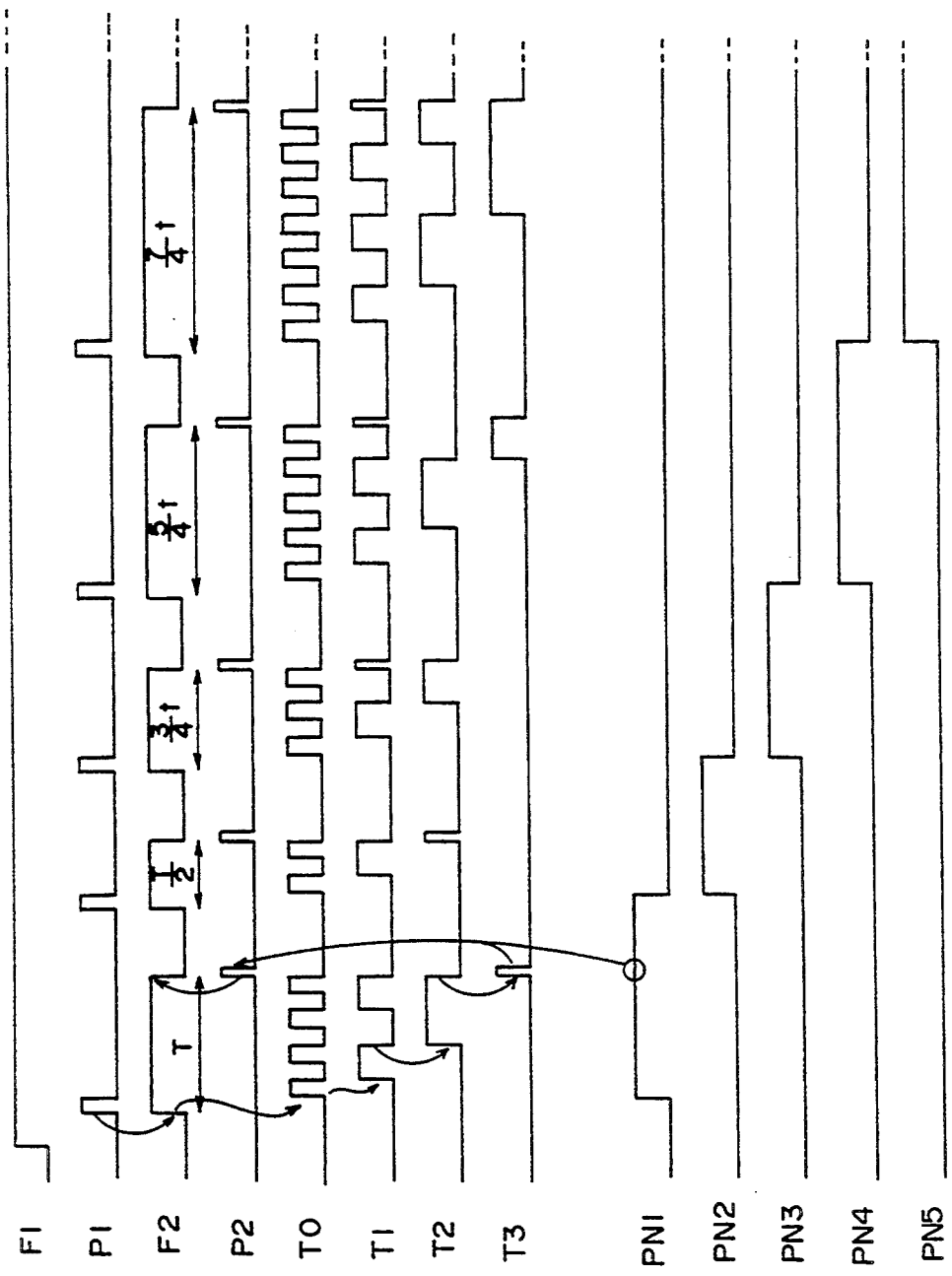
FIG. 29 is a timing chart showing operations in the sixth embodiment of the present invention.

FIG. 28 is a circuit diagram in the sixth embodiment. This diagram shows similar circuit configuration to FIGS. 22 and 24 except for logic gates part comprised of gates 1111–1129. FIG. 29 is a timing chart showing action timings. This embodiment presents a case where the ratio of the accumulated write pulse widths up to the nth time to the accumulated those up to the (n+1)th time is set to 1.5. It is herein required that a period of TO be set to ¼ as small as the fastest cell write time T. Time outputs T through T7 are, as illustrated in FIG. 28, selected by outputs PN1 through PN10 of the writing number counter. The ratio k of the total of the write pulse widths up to the nth time to the total of those up to the (n+1)th time can be thereby set to 1.5. In accordance with this embodiment, the after-the-write cell threshold level distribution can fall within a still narrower range without increasing the total write time than in the write by the equal-power pulses in the conventional example.

Circuitry employing the fuse or the like is also practicable so that an optimum value is selectable from several kinds of not-more-than 2 values k by a trade-off between the upper limit of the after-the-write cell threshold level distribution and the total write time.

The writing actions of the NAND type EEPROM have been explained so far by way of the embodiments. However, the invention can be, as a matter of course, applied to erasing actions as well. Further, the effectiveness is exhibited particularly in the NAND type EEPROM having the power supply voltage of 3 V whose after-the-write cell threshold level distribution has to be controlled to fall within an even narrower range. Moreover, the invention is also applicable to some of NOR type EEPROMs, wherein erasing is conducted by utilizing the tunnel phenomenon of channel portions of cell transistors. As explained before, when the present invention is applied to the devices for writing and erasing by use of the tunnel current, after-the-write/erase threshold level distributions can be controlled in the narrow ranges.

Further, the embodiments discussed in this specification have presented the example where the write pulses are used as multiplied pulses, i.e., the pulse width increases while raising it to the nth power of two such as 1:2:4:8:16 32... This lies in such a write characteristic that a shift in the threshold level of an ETOX type memory cell is proportional to a logarithm of the write time. However, the present invention still exhibits the effects even by using incremental pulses which increment linear-functionally such as 1:2:3:4:5:... The way of incrementing the incremental pulses can be of course modified in a variety of manners without departing from the gist of the invention.

Moreover, though repeatedly stated, the write pulse generation circuit in the second embodiment can be widely generally employed without being limited to the internal circuit of the non-volatile semiconductor memory device.

According to the present invention, the non-volatile semiconductor memory device having a short write time can be provided.

It is apparent that, in this invention, a wide range of different working modes can be formed based on the invention without deviating from the spirit and scope of the invention. This invention is not restricted by its specific working modes except being limited by the appended claims.

We claim:

1. A non-volatile semiconductor memory device comprising:
   writing means for writing data in a non-volatile memory cell in response to a write pulse, said write pulse causing said writing means to apply a write signal to said memory cell for a writing time;
   readout means for reading out data stored in the memory cell;
   verification means for verifying that normal writing to the memory cell has been completed by reading data from the memory cell after each writing; and
   said writing means being coupled to said verification means and being responsive to an unsuccessful attempt to write to a particular memory cell detected using said verification means said writing means utilizing a longer writing time for a subsequent attempt to write to the particular memory cell.

2. The non-volatile semiconductor memory device according to claim 1, wherein said writing time increases from an initial value by a predetermined multiplication factor for each successive writing.

3. The non-volatile semiconductor memory device according to claim 1, wherein said writing time increases by a predetermined multiplication factor for initial several writings and after that said writing time is set at a predetermined constant value.

4. The non-volatile semiconductor memory device according to claim 1, wherein said writing time is set to a predetermined constant value for initial several writings, set to increase by a predetermined multiplication factor for several subsequent writings, and set to a predetermined constant value for further subsequent writings.

5. The non-volatile semiconductor memory device according to claim 1, wherein said writing time increases by a predetermined increment in response to an unsuccessful writing of the memory cell.

6. The non-volatile semiconductor memory device according to claim 1, wherein said writing period is set in a manner that accumulated writing times increase from one writing to it next writing for those memory cells which have previously undergone an unsuccessful writing attempt.

7. The non-volatile semiconductor memory device according to claim 1, further comprising a writing pulse control circuit supplying a writing time signal to said writing means, said writing time signal varying according to it number of writings.

8. The non-volatile semiconductor memory device according to claim 7, wherein said writing pulse control circuit comprises:
   pulse generating means for generating pulses of a predetermined frequency; and
   counting means for counting said pulses generated by said pulse generating means using a count value set in accordance with said number of writing actions.

9. A non-volatile semiconductor memory device comprising:
   writing means for writing data in a non-volatile memory cell in response to a write pulse, wherein said writing means can vary a writing time for successive writings;

readout means for reading out data stored in the memory cell;

verification means for verifying that normal writing to the memory cell has been completed by reading data from the memory cell after each writing; and a writing pulse control circuit coupled to said writing means for controlling a duration of said writing time, said writing pulse control circuit comprising:

a plurality of capacitors of different capacities;

a resistive discharging path for discharging charges stored in said capacitors; and selecting means for selecting one capacitor from said plurality of capacitors to connect it to said discharging path according to number of writing actions.

10. A non-volatile semiconductor memory device comprising:

writing means for writing data in a non-volatile memory cell in response to a write pulse, wherein said writing means can vary a writing time for successive writings;

readout means for reading out data stored in the memory cell;

verification means for verifying that normal writing to the memory cell has been completed by reading data from the memory cell after each writing; and a writing pulse control circuit coupled to said writing means for controlling a duration of said writing time, said writing pulse control circuit comprising;

a capacitor;

a plurality of resistive discharging paths for discharging charges stored in said capacitor; and selecting means for selecting one discharging path from said plurality of discharging paths and for connecting said one discharging path to said capacitor.

* * * * *